(12) United States Patent
Choi et al.

(10) Patent No.: US 7,341,895 B2
(45) Date of Patent: Mar. 11, 2008

(54) THIN FILM TRANSISTOR SUBSTRATE AND FABRICATING METHOD THEREOF

(75) Inventors: Seung Kyu Choi, Teegu-shi (KR); Jae Moon Soh, Kyoungsangbuk-do (KR); Jong Woo Kim, Kyoungsangbuk-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 167 days.

(21) Appl. No.: 11/003,386

(22) Filed: Dec. 6, 2004

(65) Prior Publication Data
US 2005/0095757 A1 May 5, 2005

Related U.S. Application Data

(62) Division of application No. 10/028,304, filed on Dec. 28, 2001, now Pat. No. 6,921,917.

(30) Foreign Application Priority Data
Dec. 29, 2000 (KR) .................. 10-2000-85362

(51) Int. Cl.
*H01L 21/00* (2006.01)
(52) U.S. Cl. ............ 438/151; 438/149; 438/106; 349/141
(58) Field of Classification Search ......... 438/151, 438/149, 106
See application file for complete search history.

(56) References Cited

U.S. PATENT DOCUMENTS

| | | | | |
|---|---|---|---|---|
| 5,398,127 A * | 3/1995 | Kubota et al. | | 349/42 |
| 5,854,665 A * | 12/1998 | Iba | | 349/119 |
| 6,064,451 A * | 5/2000 | Oh et al. | | 349/40 |
| 6,088,078 A * | 7/2000 | Kim et al. | | 349/141 |
| 6,091,472 A * | 7/2000 | Itoh et al. | | 349/133 |
| 6,115,087 A * | 9/2000 | Ohi | | 349/38 |
| 6,128,061 A * | 10/2000 | Lee et al. | | 349/141 |
| 6,154,266 A * | 11/2000 | Okamoto et al. | | 349/129 |
| 6,211,937 B1 * | 4/2001 | Miyachi et al. | | 349/156 |
| 6,256,081 B1 * | 7/2001 | Lee et al. | | 349/141 |
| 6,344,889 B1 * | 2/2002 | Hasegawa et al. | | 349/129 |
| 6,466,290 B2 * | 10/2002 | Kim et al. | | 349/141 |
| 6,738,110 B2 * | 5/2004 | Lee | | 349/46 |
| 6,906,770 B2 * | 6/2005 | Kim et al. | | 349/141 |
| 6,921,917 B2 * | 7/2005 | Choi et al. | | 257/59 |
| 6,933,997 B2 * | 8/2005 | Kim | | 349/139 |
| 6,946,680 B2 * | 9/2005 | Jang | | 257/59 |
| 6,975,367 B2 * | 12/2005 | Lim | | 349/43 |
| 2002/0084459 A1 * | 7/2002 | Choi et al | | 257/72 |
| 2003/0117560 A1 * | 6/2003 | Yang et al | | 349/141 |
| 2004/0031991 A1 * | 2/2004 | Jang | | 257/347 |
| 2004/0066472 A1 * | 4/2004 | Lim | | 349/43 |
| 2004/0125260 A1 * | 7/2004 | Kim et al. | | 349/43 |
| 2004/0125302 A1 * | 7/2004 | Kim | | 349/141 |
| 2005/0095757 A1 * | 5/2005 | Choi et al. | | 438/151 |
| 2006/0001027 A1 * | 1/2006 | Jang | | 257/72 |

* cited by examiner

*Primary Examiner*—Laura M. Schillinger
(74) *Attorney, Agent, or Firm*—McKenna, Long & Aldridge LLP

(57) ABSTRACT

A thin film transistor substrate and a fabricating method thereof that are capable of improving an aperture ratio. A gate electrode on that substrate has an inclined head and a concave neck.

8 Claims, 38 Drawing Sheets

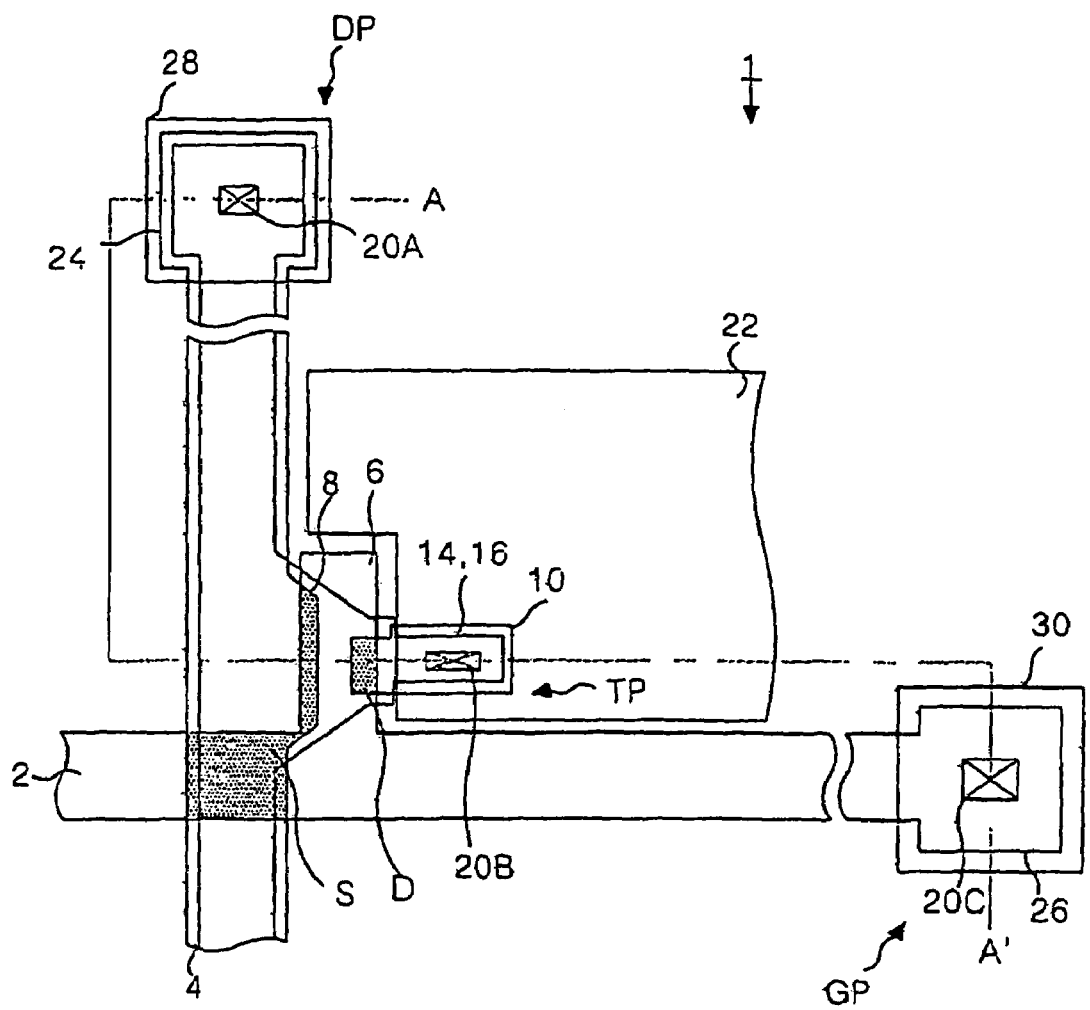

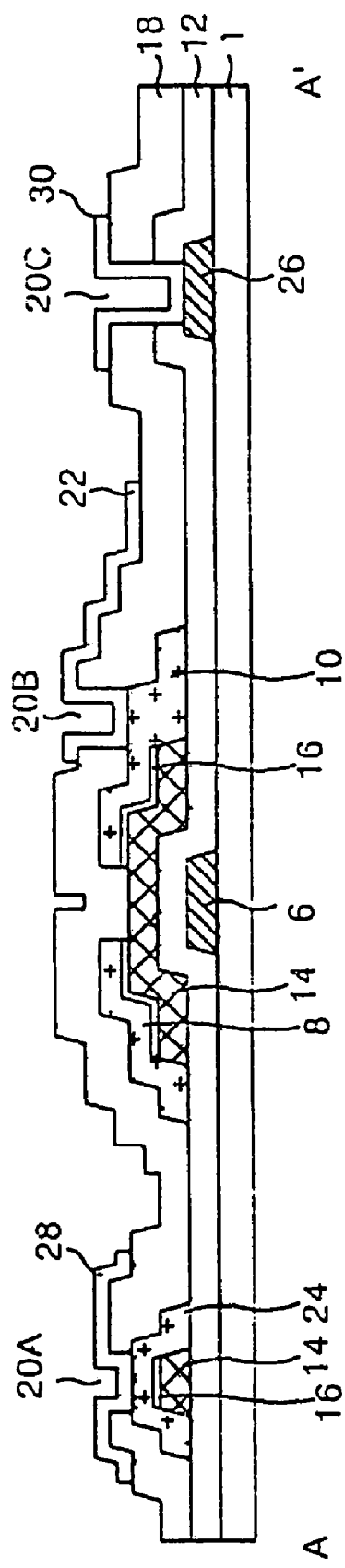

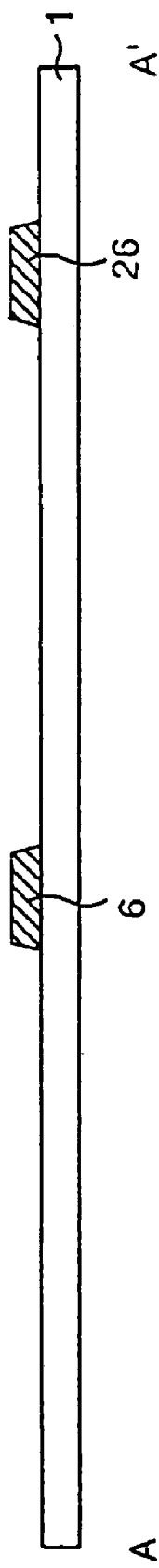
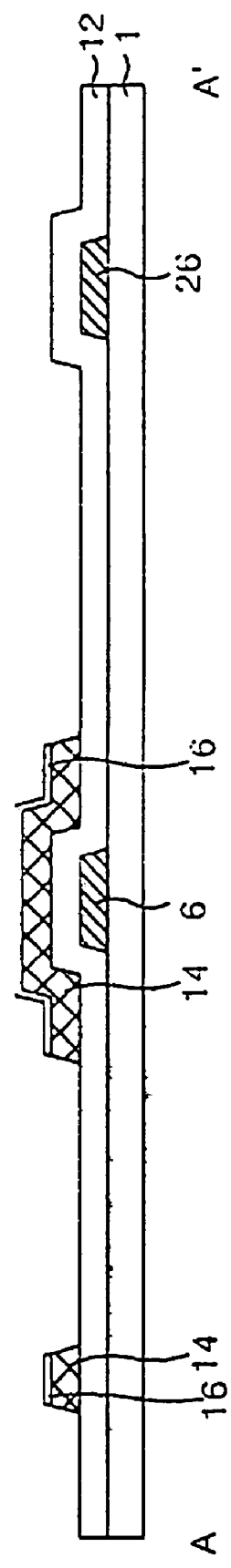
FIG.3A CONVENTIONAL ART
FIG.3B CONVENTIONAL ART

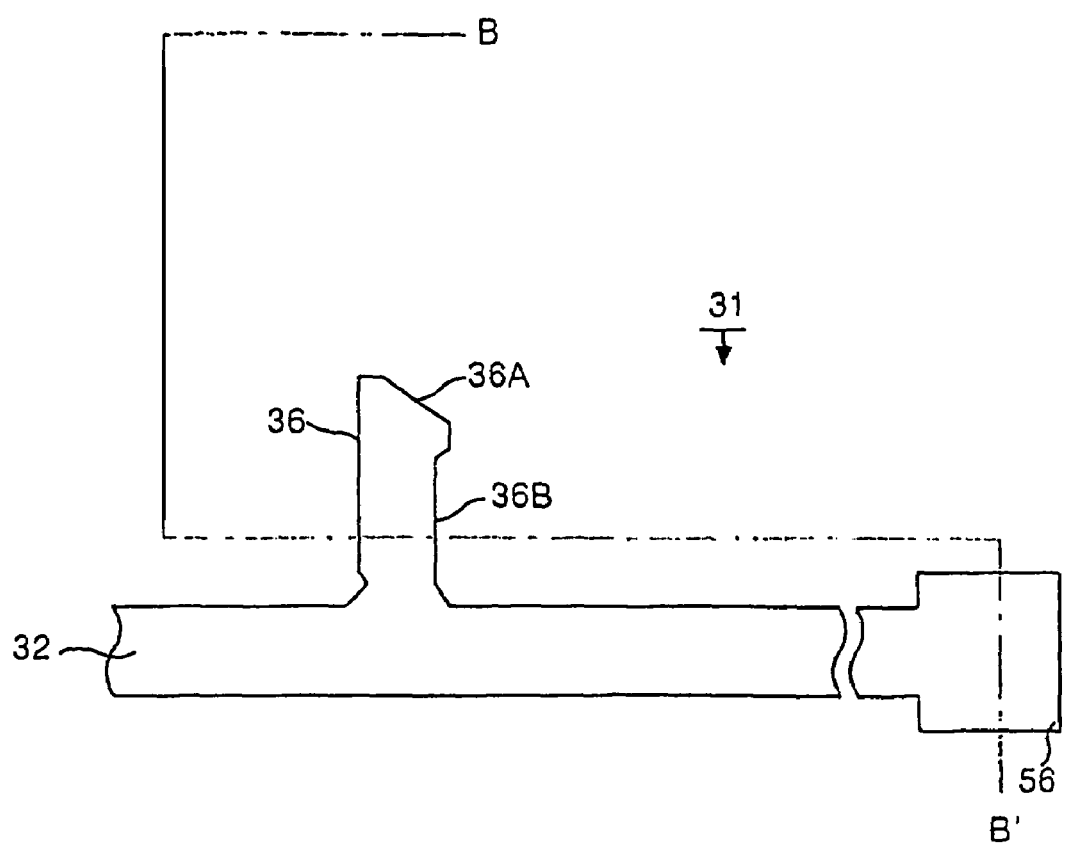

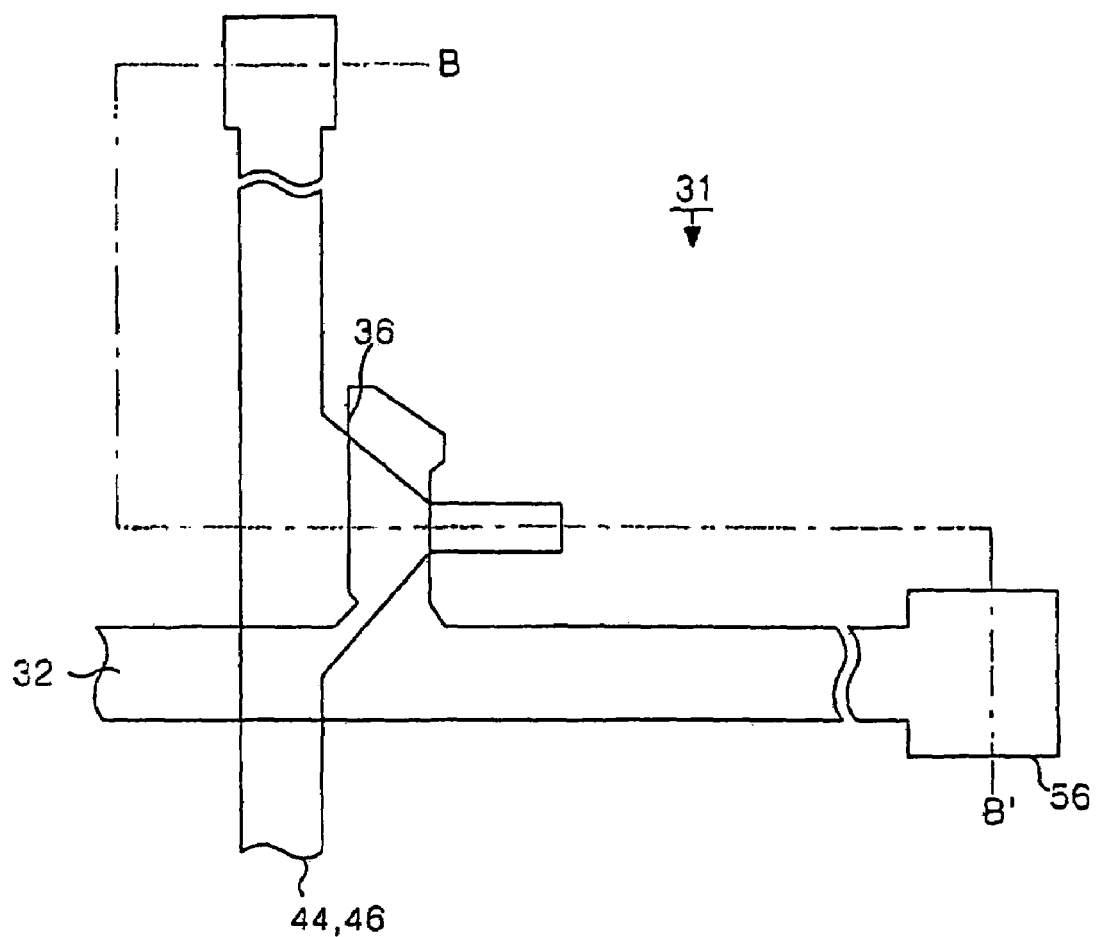

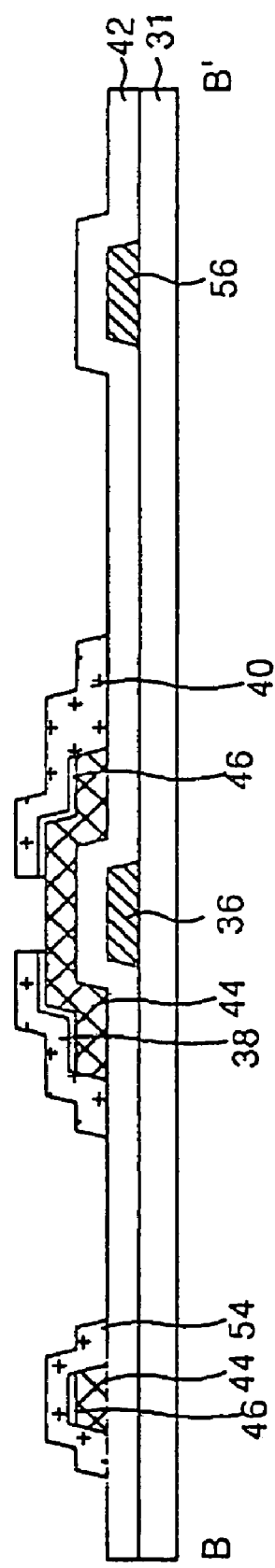

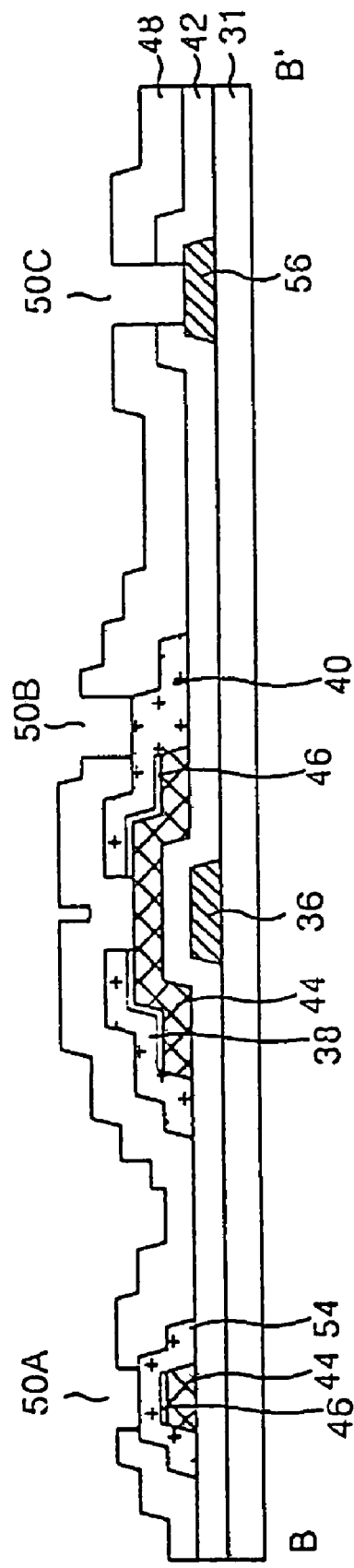

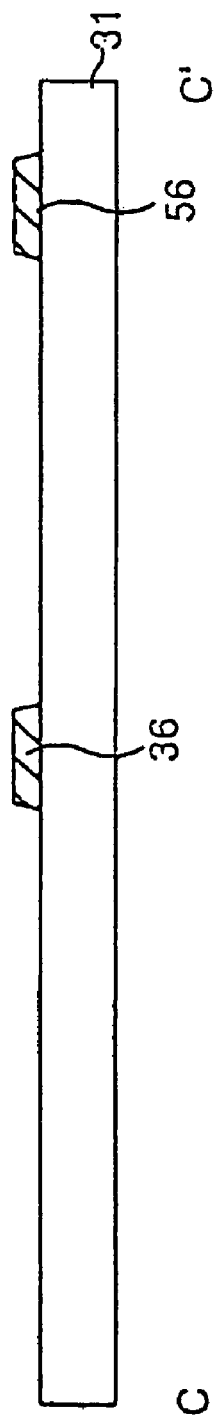
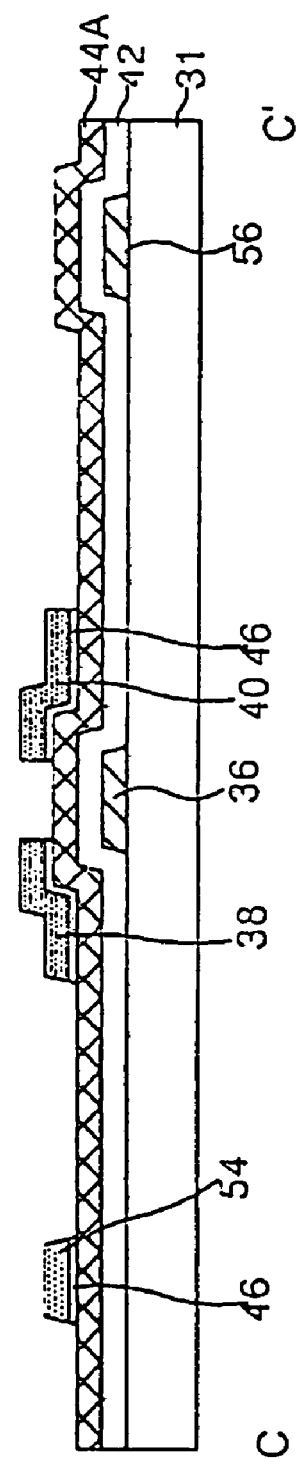
FIG.11A
FIG.11B

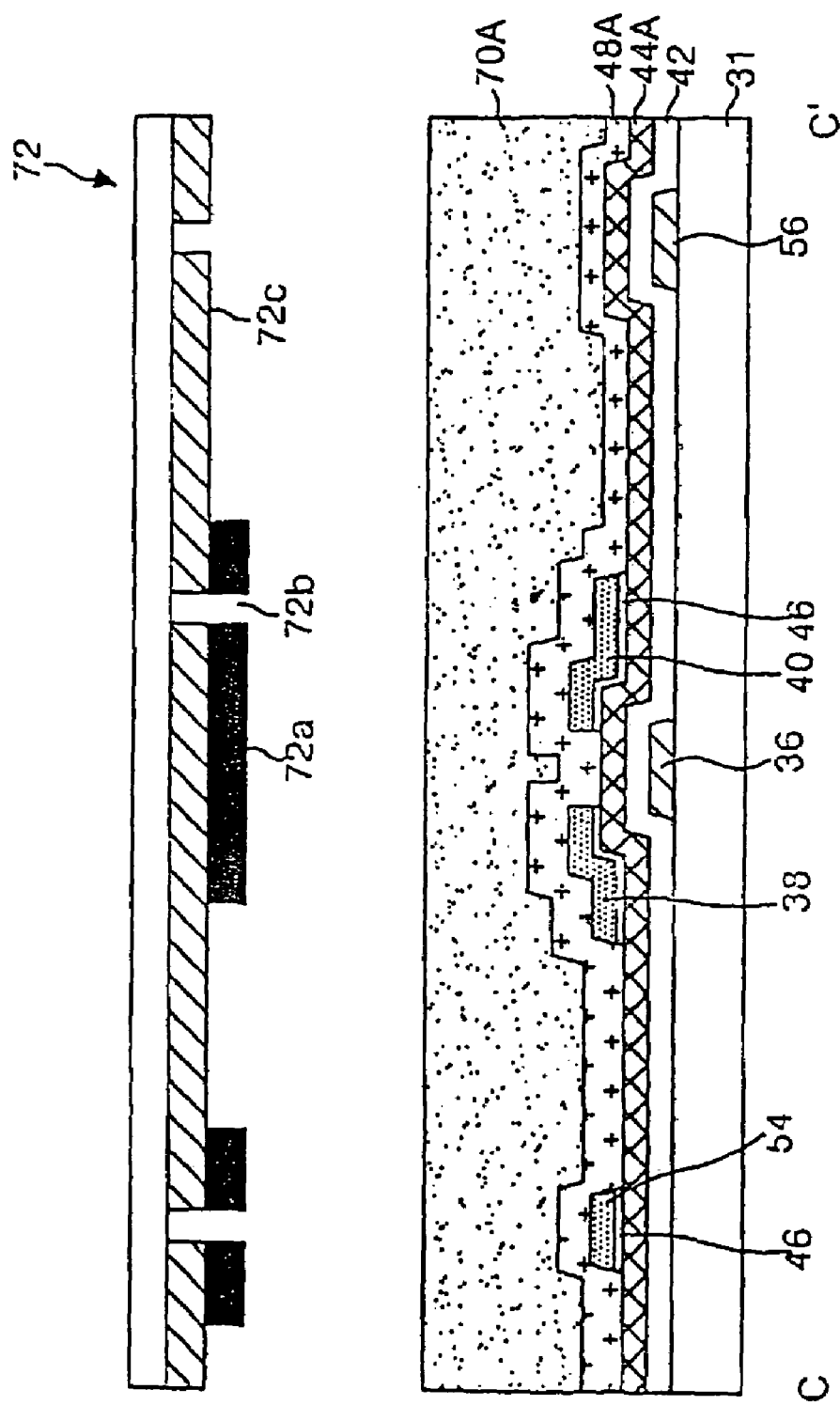

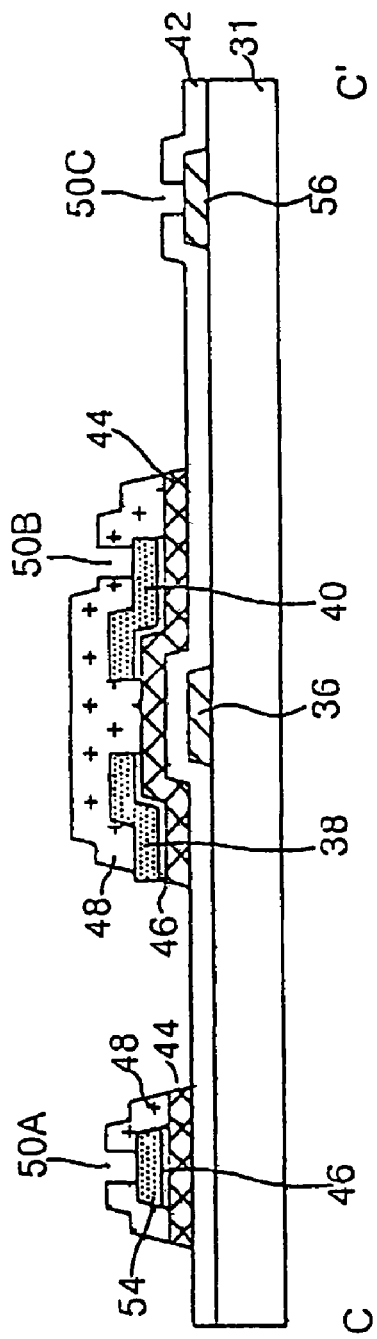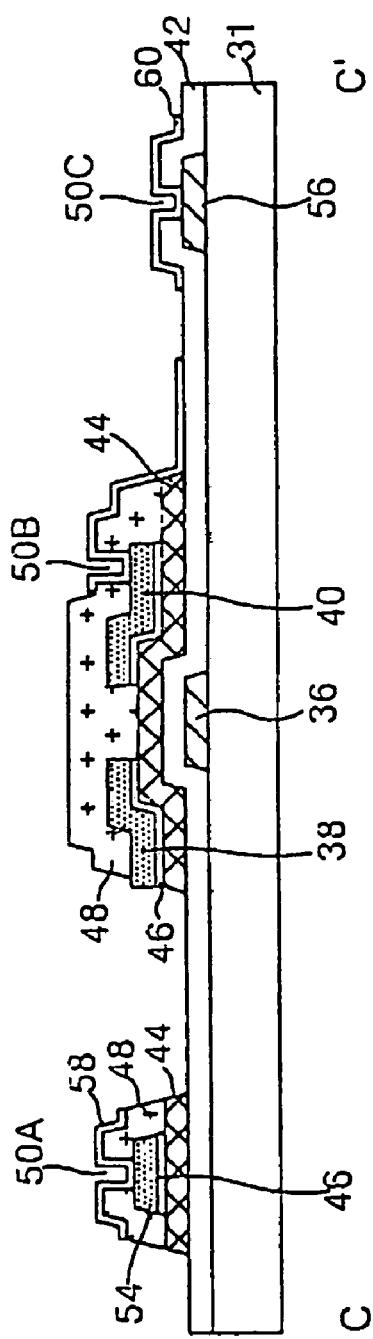

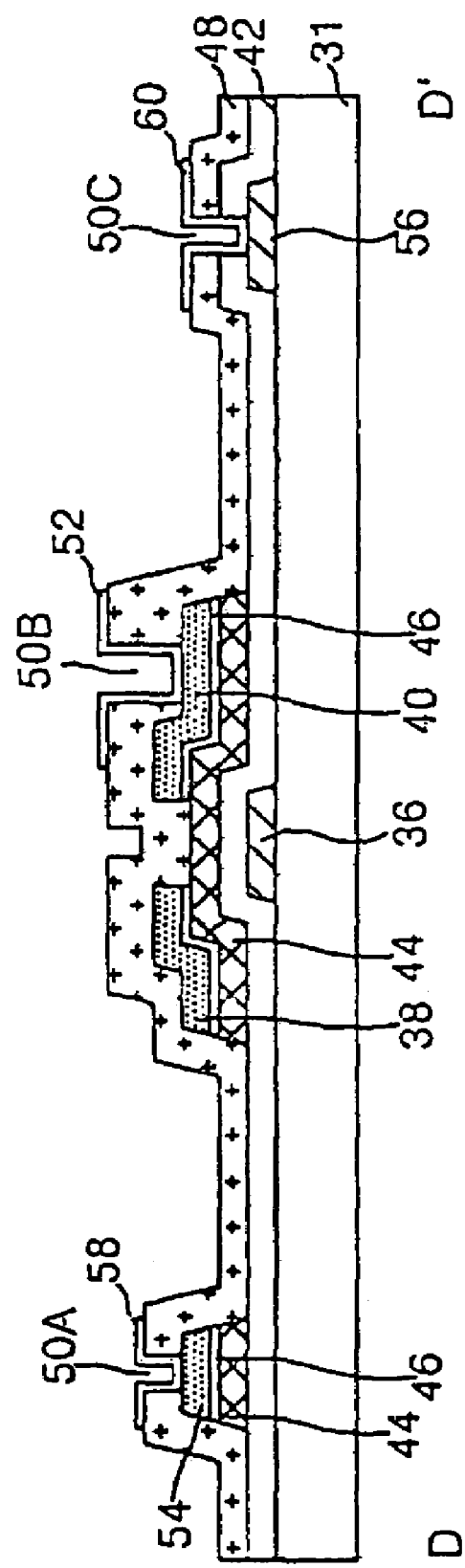

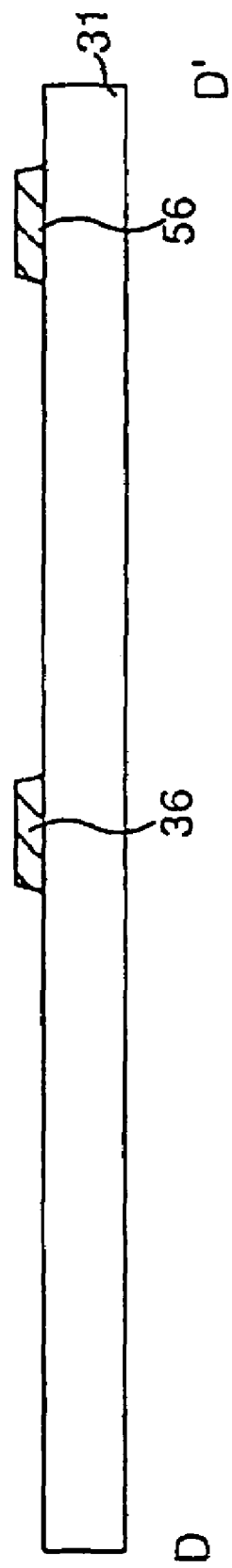

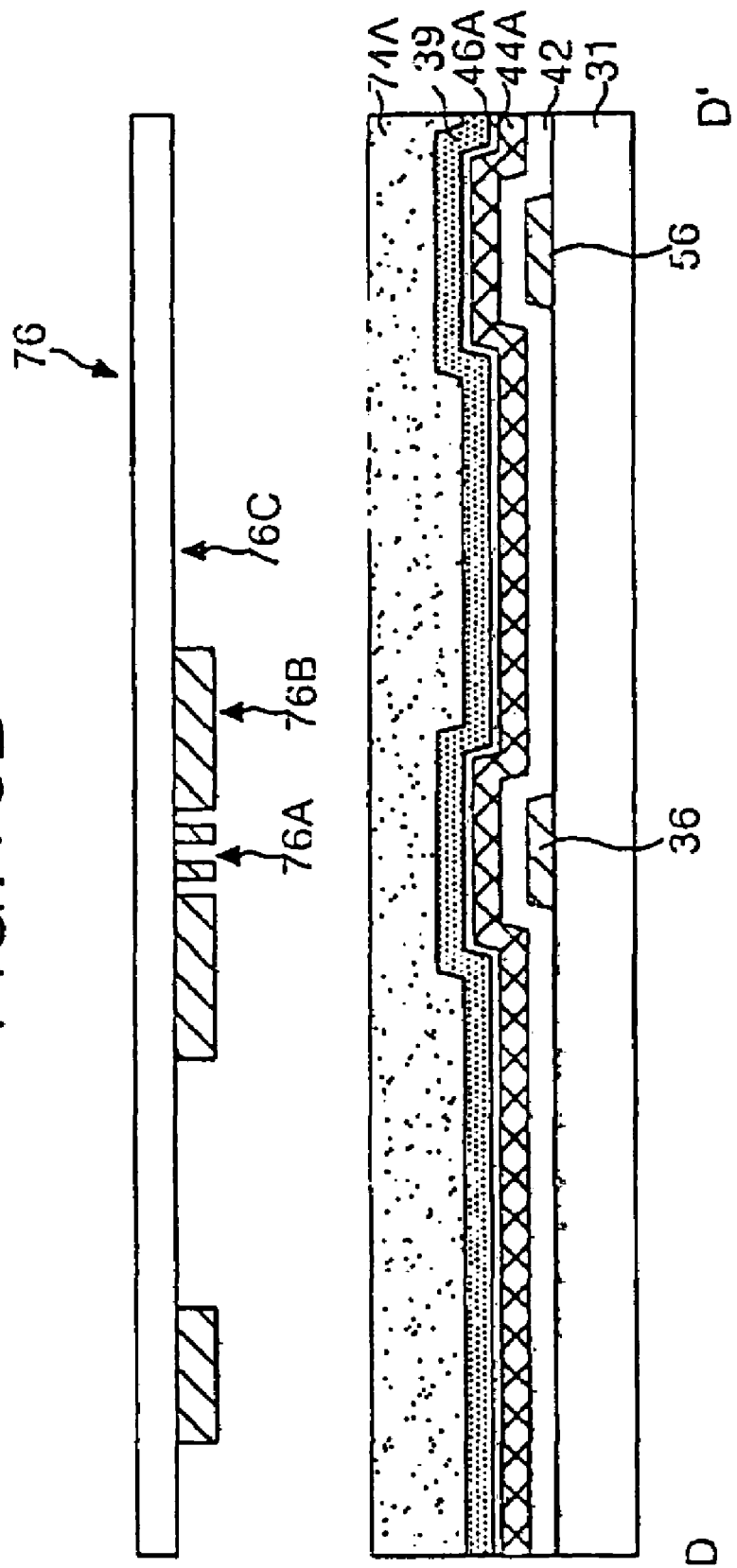

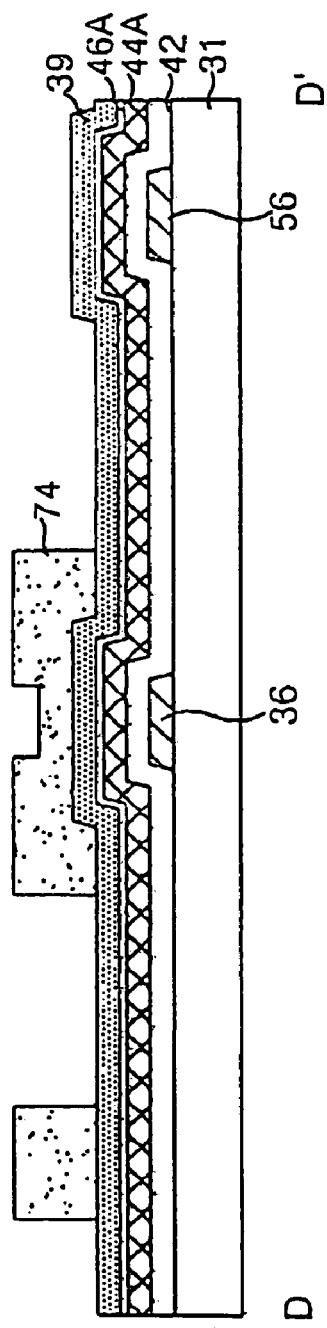
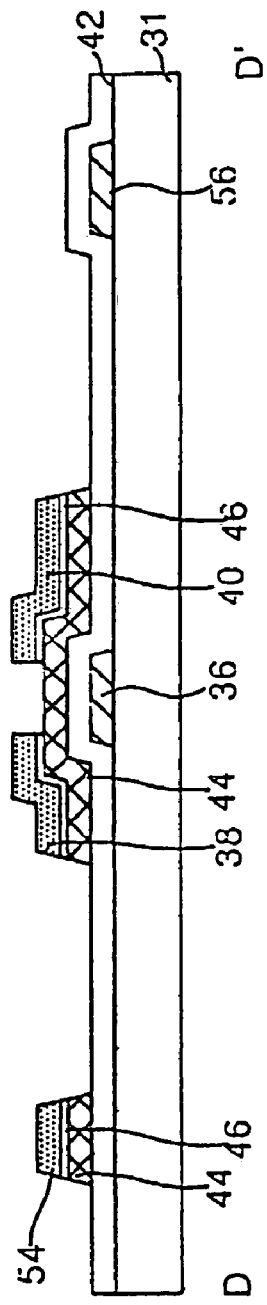

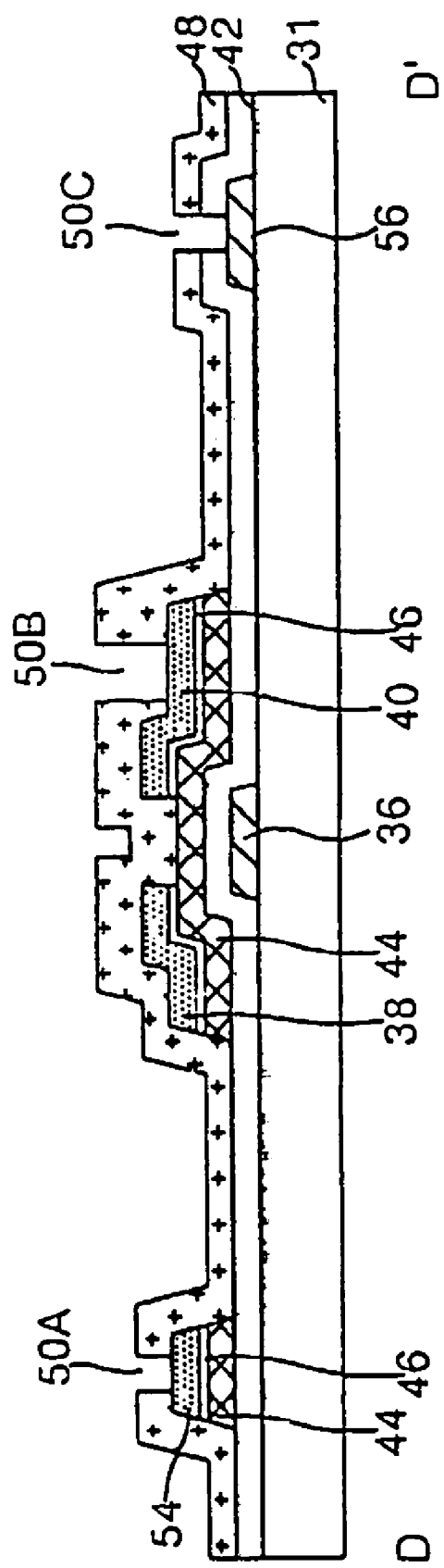

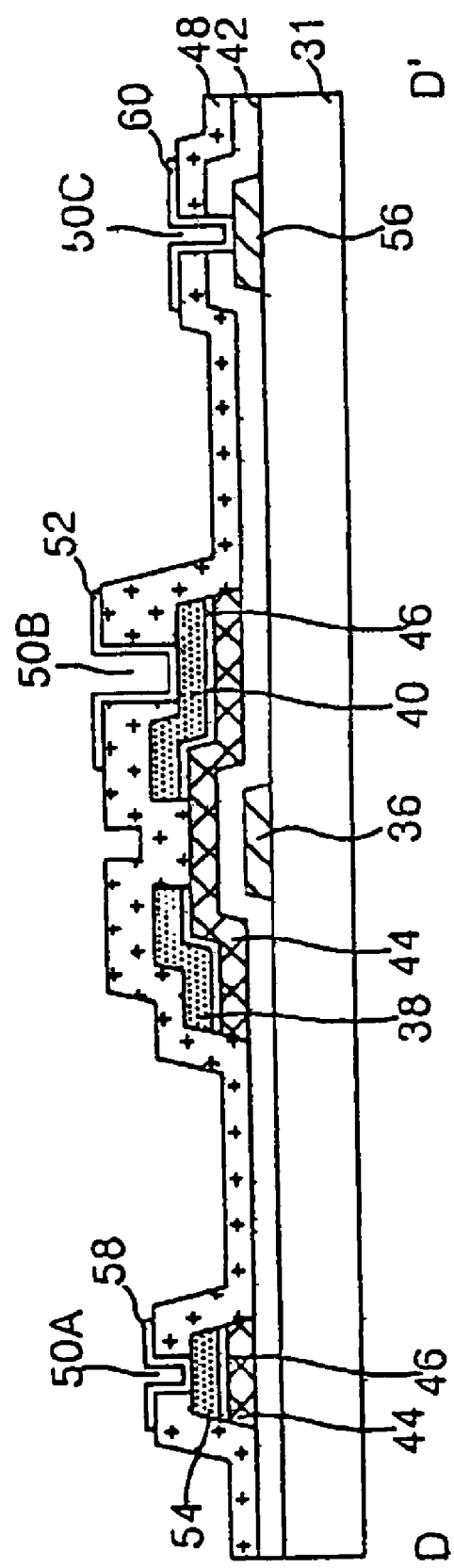

THIN FILM TRANSISTOR SUBSTRATE AND FABRICATING METHOD THEREOF

This application is a divisional of prior application Ser. No. 10/028,304, filed Dec. 28, 2001 now U.S. Pat. No. 6,921,917.

This application claims the benefit of Korean Patent Application No. P2000-85362 filed Dec. 29, 2000, which is hereby incorporated by reference.

BACKGROUND OF THE INVENTION

1. Field of the Invention

This invention relates to a thin film transistor substrate for a liquid crystal display. More particularly, it relates to a thin film transistor substrate, and to a method of fabricating that substrate, having an improved aperture ratio.

2. Description of the Related Art

Generally, a liquid crystal display (LCD) uses an active matrix drive system to produce a moving image. Such systems typically use thin film transistors (TFT's) as switching devices that selectively control individual pixels. Since LCDs can be made relatively small, they have become widely used in personal computers, notebook computers, office equipment (such as copiers), cellular phones, and pagers.

An LCD display usually includes a thin film transistor (TFT) substrate. Referring now to FIG. 1 and to FIG. 2, a typical TFT substrate 1 includes a TFT TP arranged at an intersection between a data line 4 and a gate line 2. A pixel electrode 22 is connected to a TFT drain electrode 10. A data pad portion DP is connected to the data line 4, and a gate pad portion GP is connected to the gate line 2.

The TFT TP includes a gate electrode 6 connected to the gate line 2, and a source electrode 8 connected to the data line 4. Additionally, the drain electrode 10 is connected to the pixel electrode 22 via a drain contact hole 20B. Further, the TFT TP includes semiconductor layers 14 and 16 for defining a channel between the source electrode 8 and the drain electrode 10. Such a TFT responds to gate signals on the gate line 2 by selectively applying data signals on the data line 4 to the pixel electrode 22.

The pixel electrode 22 is positioned in a pixel cell area defined by data lines 4 and gate lines 2. The pixel electrode 22 is comprised of a transparent conductive material having a high light transmissivity. Potential differences between the pixel electrode 22 and a common transparent electrode (not shown) on an upper substrate (also not shown) are produced by data signals applied via the contact hole 20B. The potential differences cause the optical properties of a liquid crystal disposed between the lower substrate 1 and the upper substrate (not shown) to change because of the dielectric anisotropy of the liquid crystal. Thus, the liquid crystal selectively allows light from a light source to be transmitted to the upper substrate when an appropriate data signal is applied to the pixel electrode 22.

The gate pad portion DP applies scanning signals comprised of gate pulses from a gate driving integrated circuit (IC) (which is not shown) to the gate lines 2. A gate pad terminal electrode 30 electrically contacts a gate pad 26 via a gate contact hole 20C.

The data pad portion DP applies data signal from a data driving IC (not shown) to the data line 4. A data pad terminal electrode 28 electrically contacts to a data pad 24 via a data contact hole 20A.

An LCD further includes an alignment layer that provides an initial alignment of a liquid crystal (which is not shown) that is disposed between the TFT substrate and the upper substrate. That alignment layer is provided with an alignment structure that aligns the liquid crystal molecules to provide an initial twist to the liquid crystal. That alignment structure is usually formed by rubbing the alignment layer with a special rubbing material in a carefully controlled rubbing direction. Thus, it should be understood that an LCD has a defined rubbing direction.

The TFT substrate 1 is beneficially fabricated by electrophotographic techniques. First, a gate metal layer is deposited on the TFT substrate 1. That metal layer is then patterned to form a gate line 2, the gate pad 26, and the gate electrode 6, reference FIG. 3A. Referring now to FIG. 3B, a gate insulating film is then formed over the TFT substrate 1, over the gate line 2, over the gate pad 26, and over the gate electrode 6. Then, first and second semiconductor layers are deposited on the gate insulating film 12 and over the gate electrode 6. Those semiconductor layers are patterned to form an active layer 14 and an ohmic contact layer 16.

Referring now to FIG. 3C, a data metal layer is deposited on the gate insulating film 12. That metal layer is patterned to form the data line 4, the data pad 24, the source electrode 8 and the drain electrode 10. After the source electrode 8 and the drain electrode 10 are formed, an ohmic contact layer (16) portion at a location that corresponds to the gate electrode 6 is patterned to expose the active layer 14. The portion of the active layer 14 between the source electrode 8 and the drain electrode 10 acts as a channel.

Next, as shown in FIG. 3D, an insulating material is deposited over the gate insulating film 12. That insulation material is patterned to form the protective layer 18 (reference FIG. 2). The data contact hole 20a and the drain contact hole 20B for exposing the data pad 24 and the drain electrode 10, respectively, through the protective layer 18, and the gate contact hole 20C for exposing the gate pad 26 through the protective layer 18 and the gate insulating film 12, are then defined.

After that, a transparent conductive material is deposited on the protective layer 18. That material is patterned to form the pixel electrode 22, the gate pad terminal electrode 30, and the data pad terminal electrode 28, reference FIG. 3E. The pixel electrode 22 electrically contacts the drain electrode 10 via the drain contact hole 20b. The gate pad terminal electrode 30 electrically contacts the gate pad 26 via the gate contact hole 20c. The data pad terminal electrode 28 electrically contacts the data pad 24 via the data contact hole 20a.

In the TFT TP described above, the gate electrode 6 has a rectangular shape. Referring now to FIG. 1, an overlapping area D between the gate electrode 6 and the drain electrode 10, and an overlapping area S between the gate electrode 6 and the source electrode 8 exist. As those areas are enlarged, parasitic capacitances Cgd and Cgs, which are proportional to the overlapping areas D and S, are increased. The increases of the parasitic capacitances Cgd and Cgs produce a flicker and a residual image that reduce picture quality. Furthermore, the resulting LCD device has a problem in that the upper edge of the gate electrode 6 limits an aperture ratio.

SUMMARY OF THE INVENTION

Accordingly, it is an object of the present invention to provide a thin film transistor substrate and a fabricating method thereof that are adaptive for high picture quality.

A further object of the present invention is to provide a thin film transistor substrate and a fabricating method thereof that are capable of improving an aperture ratio.

In order to achieve these and other objects of the invention, a thin film transistor substrate according to one aspect of the present invention includes a source electrode connected to a data line to enable reception of video data; a drain electrode opposed to the source electrode and having a desired size channel therebetween; and a gate electrode that responds to control signals so as to open and close the channel between the source electrode and the drain electrode, wherein an upper portion, or head, of the gate electrode has at least one side inclined at a desired angle.

In the thin film transistor, the head of the gate electrode is beneficially inclined parallel to a rubbing direction of the liquid crystal. The head of the gate electrode is beneficially inclined between about 35° to 45° from the longitudinal direction of the gate electrode. The gate electrode beneficially includes a concave neck that reduces overlap of the gate electrode with the drain electrode. Additionally, the neck width is thinner, by at most about 5 μm, than a maximum width of the head.

The thin film transistor substrate further includes a gate insulating film formed on the substrate in such a manner as to cover the gate electrode; a semiconductor layer formed on the gate insulating film at an area corresponding to the gate electrode; with the source and drain electrodes being formed on the semiconductor layer to define a channel therebetween; a protective layer formed on the gate insulating film in such a manner as to cover the source and drain electrodes; and a pixel electrode formed on the protective layer and connected to the drain electrode to drive a liquid crystal.

In the thin film transistor substrate, the pixel electrode is formed with an inclination that corresponds to the head of the gate electrode, and the pixel electrode is formed so as to correspond to the neck of the gate electrode.

The thin film transistor substrate further includes a gate insulating film formed on the substrate in such a manner as to cover the gate electrode; an active layer and an ohmic contact layer formed on the gate insulating film in such a manner as to correspond to the gate electrode; with the source and drain electrodes being formed in the same pattern as the ohmic contact layer and having a channel therebetween; a protective layer formed on the gate insulating film in such a manner as to have the same pattern as the active layer; and a pixel electrode formed on the protective layer and connected to the drain electrode.

In the thin film transistor substrate, the pixel electrode is formed with an inclination that corresponds to the head of the gate electrode, and the pixel electrode is formed so as to correspond to the neck of the gate electrode.

The thin film transistor substrate further includes a gate insulating film formed on the substrate in such a manner as to cover the gate electrode; a semiconductor layer formed on the gate insulating film at an area corresponding to the gate electrode; with the source and drain electrodes being formed in the same pattern as the semiconductor having a channel therebetween; a protective layer formed on the gate insulating film in such a manner as to cover the source and drain electrodes; and a pixel electrode formed on the protective layer and connected to the drain electrode.

The pixel electrode is beneficially formed with an inclination that corresponds to the head of the gate electrode, and the pixel electrode is beneficially formed to correspond to the neck of the gate electrode.

A method of fabricating a thin film transistor substrate according to another aspect of the present invention includes the steps of forming a gate metal layer on the substrate; and patterning the gate metal layer such that a head part positioned in the upper portion of the gate electrode has at least one side inclined at a desired angle.

The method further includes the steps of forming a gate insulating film on the substrate in such a manner as to cover the gate electrode; forming a semiconductor layer on the gate insulating film; forming the source and drain electrodes on the semiconductor layer with a channel therebetween; forming a protective layer on the gate insulating film in such a manner as to cover the source and drain electrodes; and forming a pixel electrode on the protective layer.

The method further includes the steps of forming agate insulating film on the substrate in such a manner as to cover the gate electrode; patterning a metal layer and a second semiconductor layer after depositing first and second semiconductor layers and the metal layer on the gate insulating film so as to form the source and drain electrodes; patterning the first semiconductor layer and a protective layer material after providing the protective material layer on the first semiconductor layer in such a manner as to cover the source and drain electrodes, thereby forming a protective layer and a semiconductor layer, and then forming a pixel electrode on the protective layer.

The method further includes the steps of forming a gate insulating film and a semiconductor material on the substrate in such a manner as to cover the gate electrode; forming the source and drain electrodes on the semiconductor material; simultaneously patterning the semiconductor material and a protective layer material after entirely depositing the protective layer material on the gate insulating film in such a manner as to cover the source and drain electrodes, thereby forming a semiconductor layer and a protective layer; and forming a pixel electrode on the protective layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate the embodiments of the invention and together with the description serve to explain the principles of the invention.

In the drawings:

FIG. 1 is a plan view showing a structure of a conventional thin film transistor formed with five masks;

FIG. 2 is a section view of the thin film transistor of FIG. 1 taken along the A-A' line in FIG. 1;

FIG. 3A to FIG. 3E are section views representing step by step a method of fabricating the thin film transistor show in FIG. 2;

FIG. 6A to FIG. 6E are plan views representing step by step a method of fabricating the thin film transistor of FIG. 4;

FIG. 7A to FIG. 7E are section views representing step by step a method of fabricating the thin film transistor of FIG. 5;

FIG. 11A to FIG. 11F are section views representing step by step a method of fabricating the thin film transistor of FIG. 9;

FIG. 13 is a section view of the thin film transistor of FIG. 12 taken along the D-D' line in FIG. 12

FIG. 15A to FIG. 15F are section views representing step by step a method of fabricating the thin film transistor of FIG. 13;

DETAILED DESCRIPTION OF THE ILLUSTRATED EMBODIMENTS

Reference will now be made in detail to an embodiment of the present invention, example of which is illustrated in the accompanying drawings.

FIGS. 4 through 15F illustrate various embodiments of the present invention.

Figure 3C:
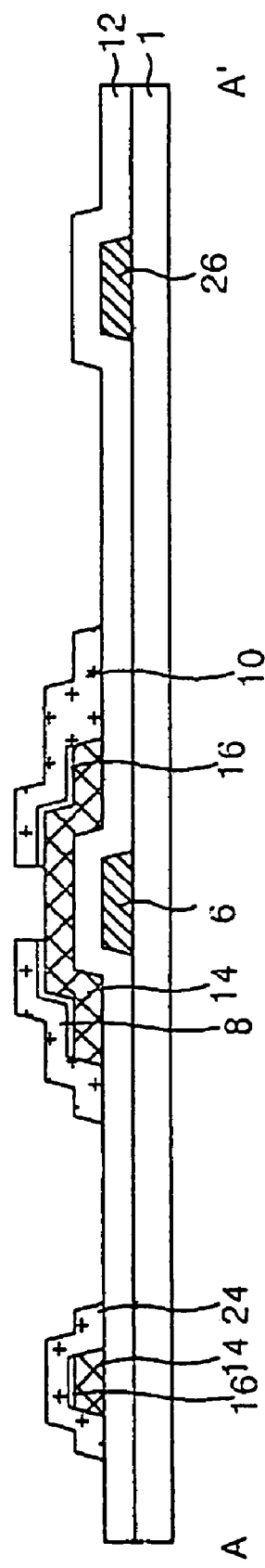
Figure 3D:
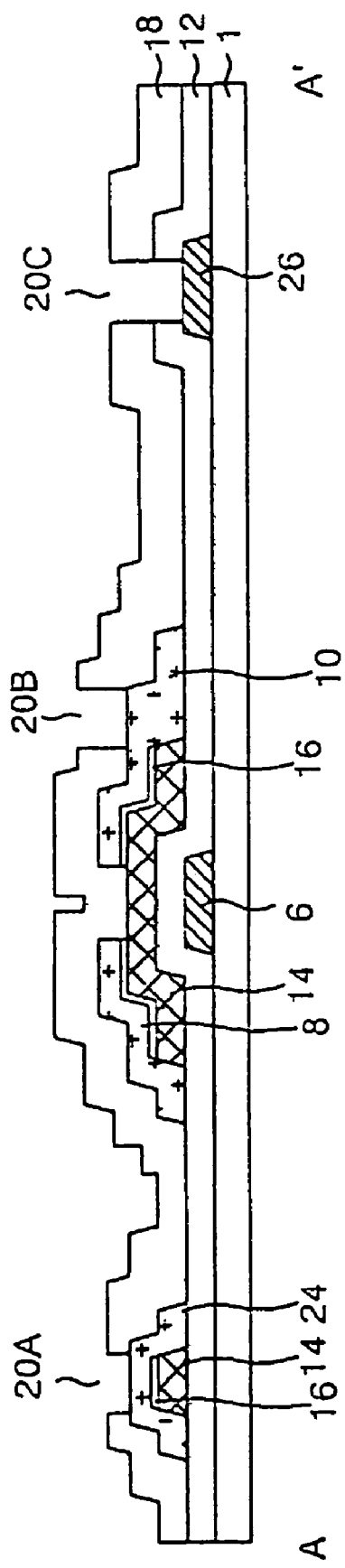
Figure 3E:
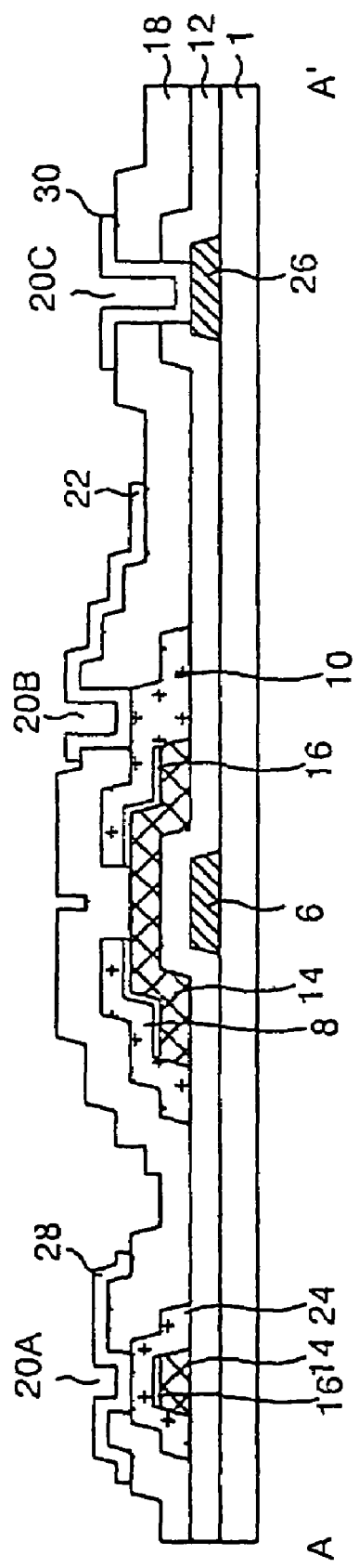
Figure 4:
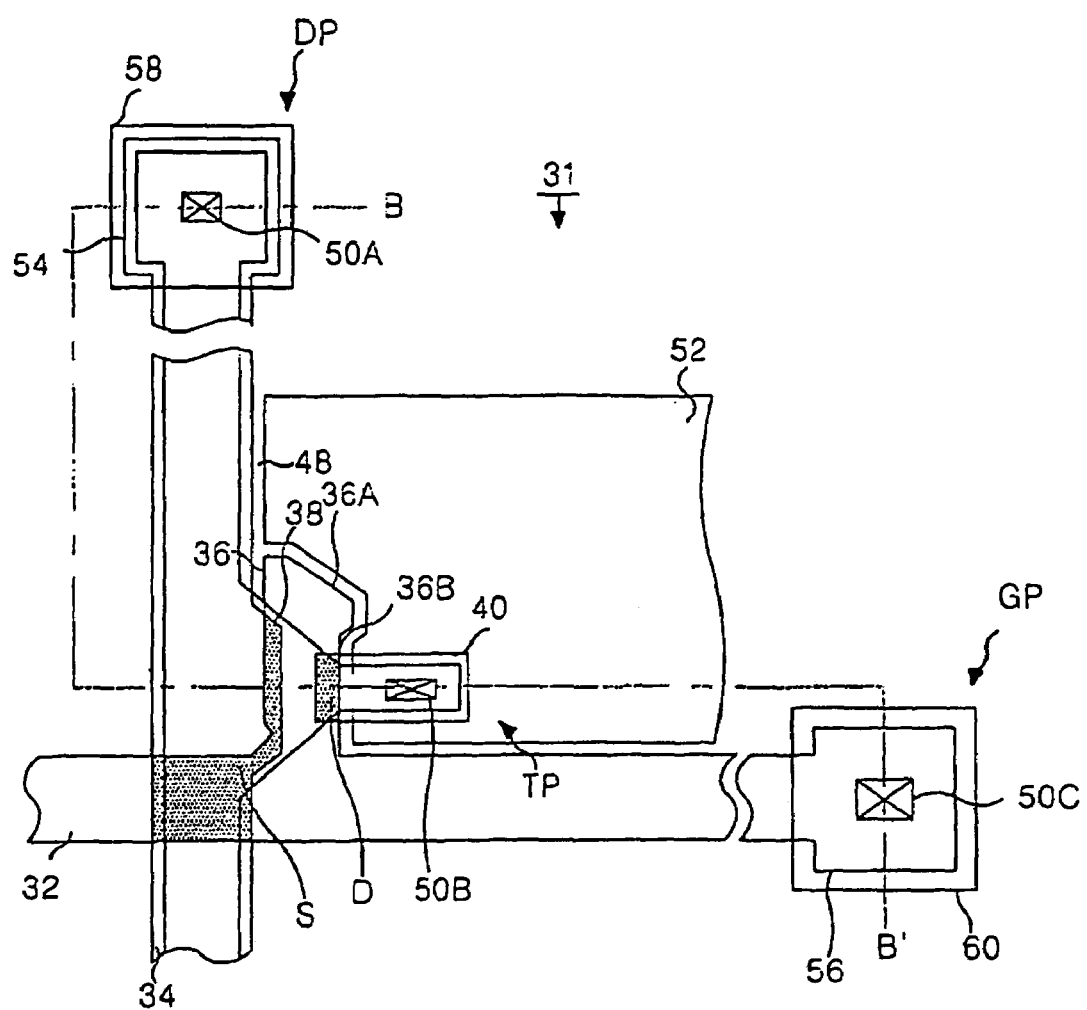
FIG. 4 is a plan view showing a structure of a thin film transistor according to a first embodiment of the present invention.
Figure 5:
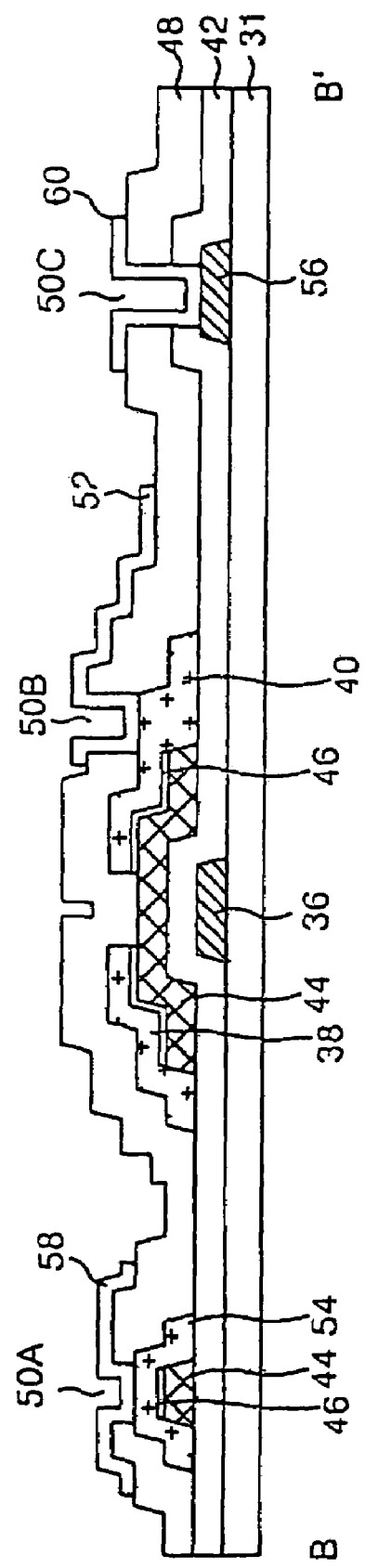
FIG. 5 is a section view of the thin film transistor of FIG. 4 taken along the B-B' line in FIG. 4

Referring now to FIG. 4 and FIG. 5, a TFT substrate 31 according to a first embodiment of the present invention includes a TFT TP arranged at an intersection between a data line 34 and a gate line 32. Additionally, a pixel electrode 52 is connected to a drain electrode 40 of the TFT TP. A data pad portion DP connects to the data line 34, and a gate pad portion GP connects to the gate line 32

The TFT also includes a gate electrode 36 connected to the gate line 32. The gate electrode 36 has an inclined head 36A and a concave neck 36B. The inclination angle of the gate electrode head 36A is about 35° to 45° (in the case of a twist nematic (TN) mode liquid crystal). Additionally, the width of the concave neck 36B is smaller, by about 5 μm, than the maximum width of the gate electrode head 36A.

The TFT TP further includes a source electrode 38 connected to the data line 34. The drain electrode 40 connects to the pixel electrode 52 via a drain contact hole 50B. The TFT also includes semiconductor layers 44 and 46 (see FIG. 6) for defining a conductive channel between the source electrode 38 and the drain electrode 40 when a gate voltage is applied to the gate electrode 36. Such a TFT responds to gate signals from the gate line 32 by selectively applying data signals on the data line 34 to the pixel electrode 52.

The pixel electrode 52 is positioned at a pixel cell area defined by data lines 34 and gate line 32s. The pixel electrode 52 is made from a transparent conductive material having a high light transmissivity. A potential difference between the pixel electrode 52 and a common transparent electrode (not shown) on an upper substrate (also not shown) is produced by data signals applied via the contact hole 50B. Such potential differences cause the optical properties of a liquid crystal disposed between the lower substrate and the upper substrate (not shown) to change because of the dielectric anisotropy of the liquid crystal. Thus, the liquid crystal selectively allows light from a light source to be transmitted to the upper substrate when an appropriate data signal is applied to the pixel electrode 52.

The TFT substrate 31 illustrated in FIG. 4 and FIG. 5 requires five masks. The gate electrode 36 is patterned using a first mask while the semiconductor layers 44 and 46 are patterned using a second mask. The source and drain electrodes 38 and 40 are patterned using a third mask, while the contact hole 50 and the protective layer 48 are patterned using a fourth mask. The pixel electrode 52 is patterned using a fifth mask.

The gate pad portion GP supplies scanning signals from a gate driving integrated circuit (not shown, but hereinafter referred to as an "IC") to the gate lines 32. A gate pad terminal electrode 60 of the gate pad portion GP electrically connects to a gate pad 56 through a gate contact hole 50C.

The data pad portion DP applies data signals to the data lines 34 from a data driving IC (which is not shown). A data pad terminal electrode 58 electrically connects to a data pad 54 through a data contact hole 50A.

FIG. 6A to FIG. 7E are section views and plan views useful for explaining a method of fabricating the TFT substrate illustrated in shown in FIGS. 5 and 6.

Figure 6C:
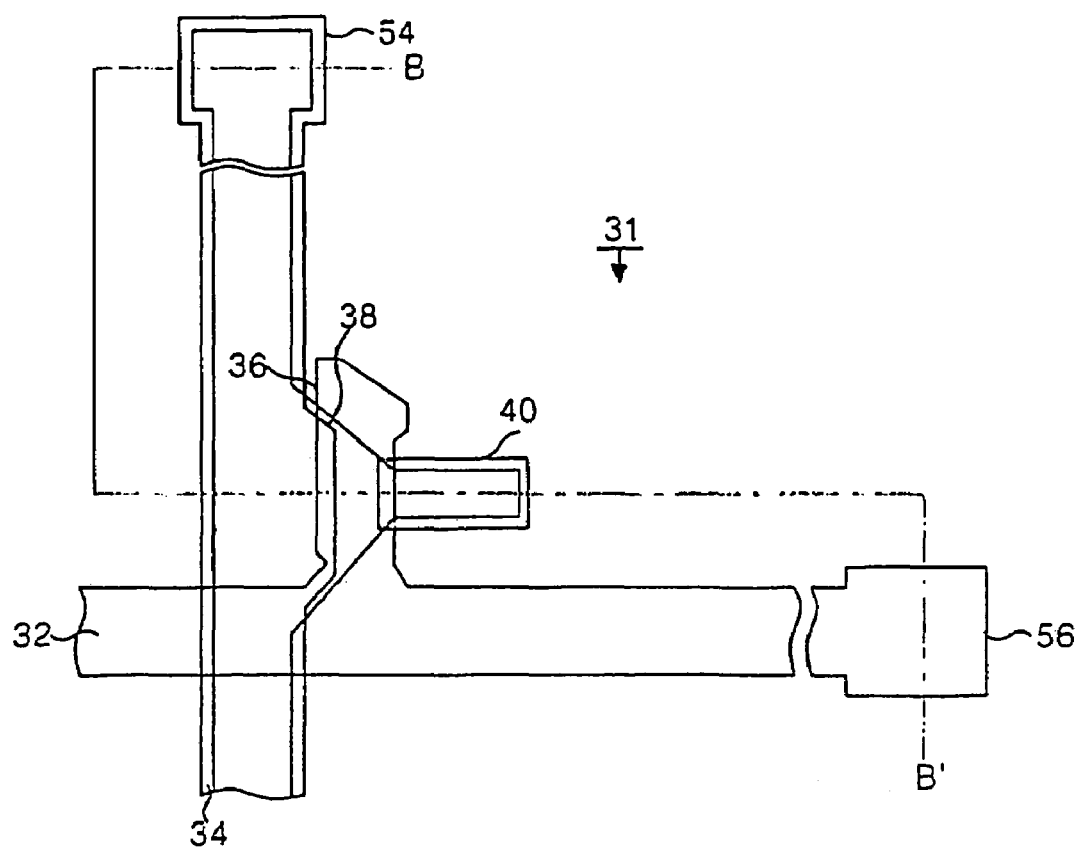
Figure 7A:
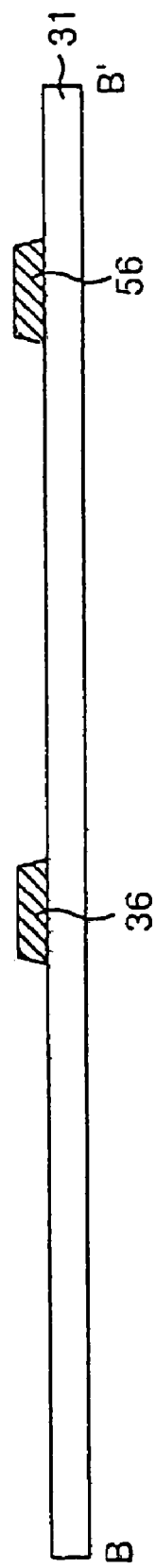

Referring first to FIGS. 6A and 7A, the gate electrode 36 having the inclined head 36A and the concave neck 36B, and the gate pad 56 are provided on the substrate 31. The gate electrode 36 and gate pad 56 are formed by depositing aluminum (Al) or copper (Cu), such as by sputtering, and then by patterning the deposited metal using a first mask. The head 36A is beneficially formed consistent with the rubbing direction used to produce uniform alignment of the liquid crystal cell (reference the background section).

Figure 7B:
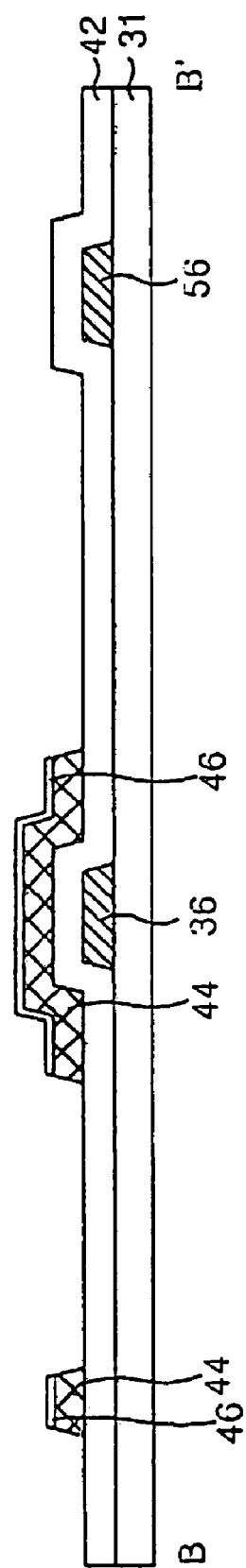

Referring now to FIG. 6B and FIG. 7B, an active layer 44 and an ohmic contact layer 46 are then provided on a gate insulating film 42. The gate insulating film 42 is formed by depositing an insulating material, such as silicon nitride (SiNx) or silicon oxide (SiOx), using plasma enhanced chemical vapor deposition (PECVD). The gate insulating film 42 covers the gate electrode 36. The active layer 44 is formed from undoped non-crystalline silicon, while the ohmic contact layer 46 is formed from highly doped non-crystalline silicon. Those layers are deposited and then patterned using the second mask.

Referring now to FIG. 6C and FIG. 7C, the data pad 54, the source electrode 38, and the drain electrode 40 are then provided. The data pad 54 is formed on the gate insulating film 42, while the source and drain electrodes 38 and 40 are formed on the ohmic contact layer 46. The data pad 54, and the source and drain electrodes 38 and 40 are made from chrome (Cr) or molybdenum (Mo). To do so, a metal layer (i.e., Cr or Mo) is deposited using CVD or the sputtering technique. Then, that metal layer is patterned using the third mask. After the source and drain electrodes 38 and 40 are formed, the ohmic contact layer 46 between the source and drain electrodes 38 and 40 and over the gate electrode 36 is patterned to expose the active layer 44. That active layer forms a channel.

Figure 6D:
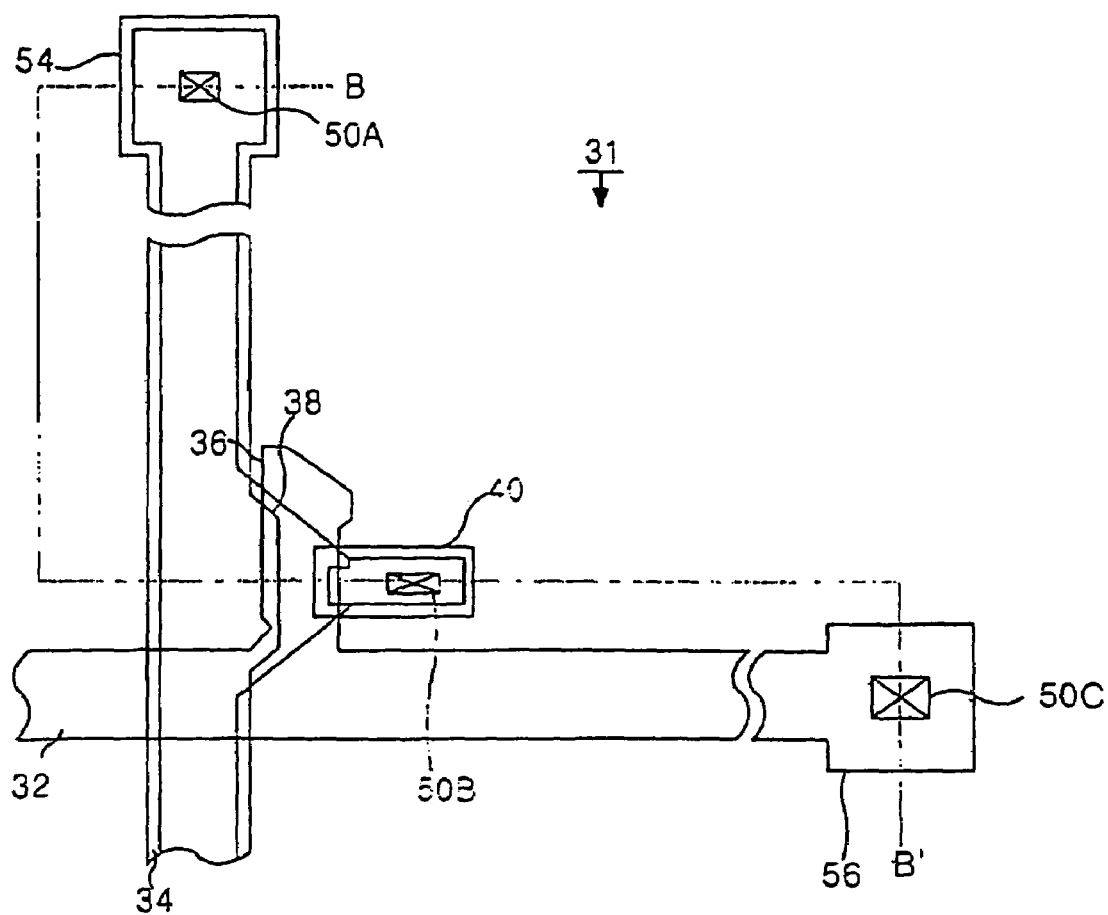

Referring now to FIG. 6D and FIG. 7D, the protective layer 48, the data contact hole 50A, the drain contact hole 50B, and the gate contact hole 50C are provided. The protective layer 48 is made from an inorganic insulating material such as silicon nitride (SiNx) or silicon oxide (SiOx), from an acrylic organic compound, or from an organic insulating material having a small dielectric constant, such as Teflon, BCB (benzocyclobutene), Cytop or PFCB (perfluorocyclobutane). The protective layer 48, the data contact hole 50A, the drain contact hole 50B and the gate contact hole 50C are formed by depositing an insulating material over the structure shown in FIGS. 7C and 8C, and then patterning that insulating material using the fourth mask.

Figure 6E:
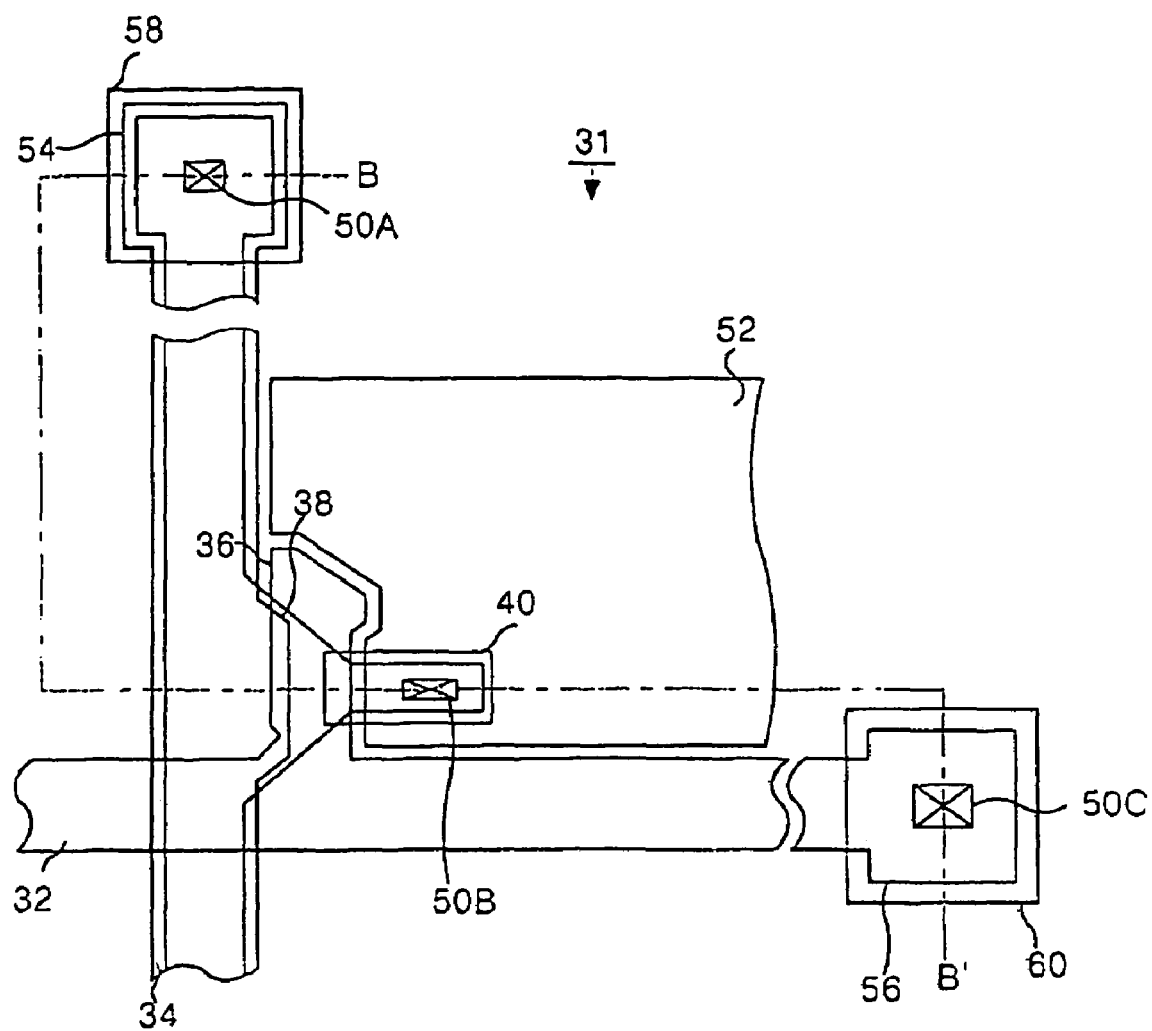
Figure 7E:
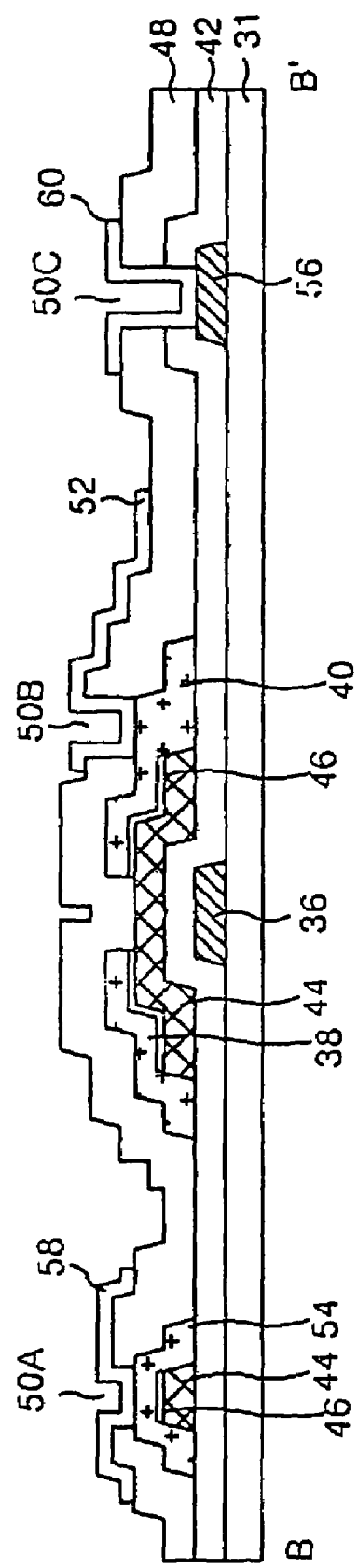

Referring now to FIG. 6E and FIG. 7E, the pixel electrode 52, the gate pad terminal electrode 60, and the data pad terminal electrode 58 are provided on the protective layer 48. The pixel electrode 52, the gate pad terminal electrode 60 and the data pad terminal electrode 58 are made from a transparent conductive material such as indium-tin-oxide (ITO), indium-zinc-oxide (IZO) or indium-tin-zinc-oxide (ITZO). The pixel electrode 52, the gate pad terminal electrode 60, and the data pad terminal electrode 58 are formed by depositing a transparent conductive material on the protective layer 48 and then patterning it with the fifth mask. The data pad terminal electrode 58 electrically connects via the data contact hole 50A to the data pad 54, the gate pad terminal electrode 60 electrically connects via the gate contact hole 50C to the gate pad 56, and the pixel electrode 52 electrically connects via the drain contact hole 50B to the drain electrode 40.

Figure 8:
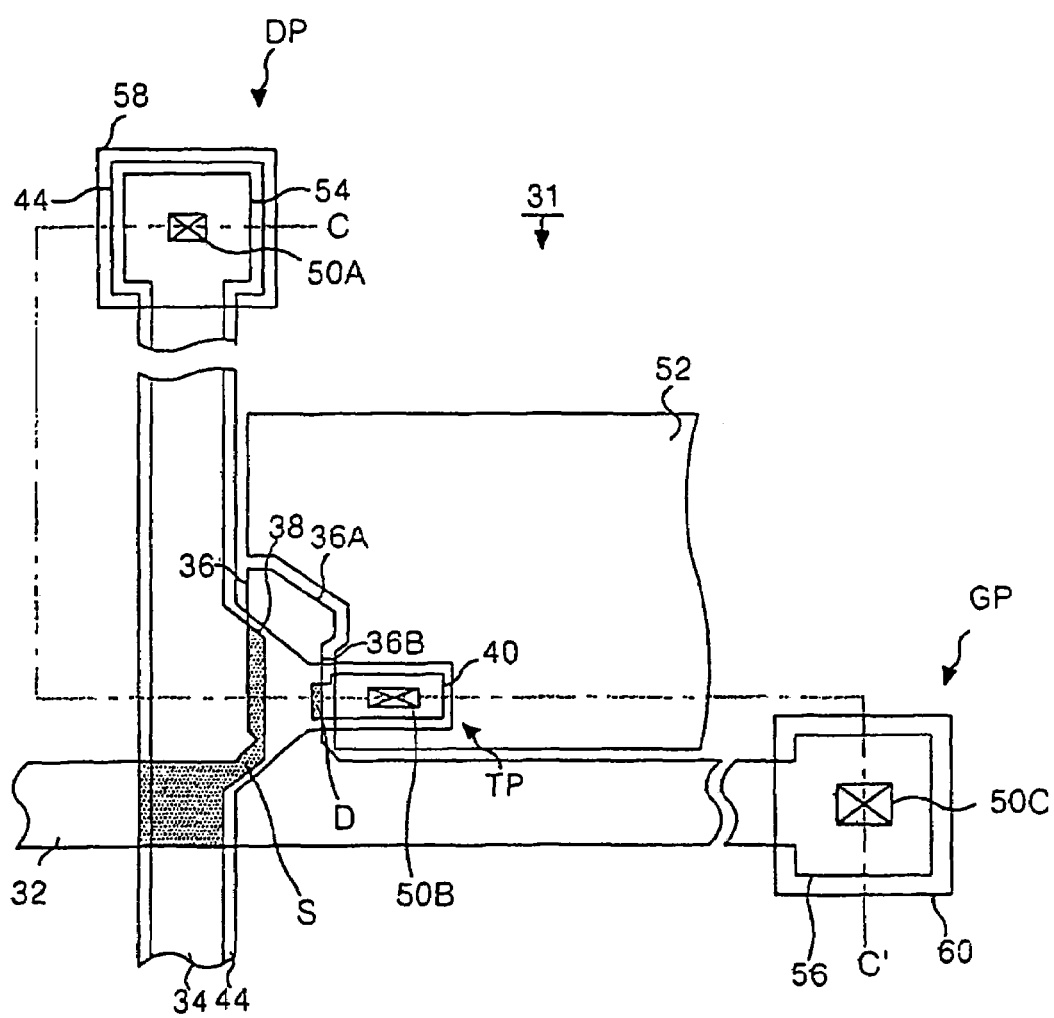
FIG. 8 is a plan view showing a structure of a thin film transistor according to a second embodiment of the present invention.
Figure 9:
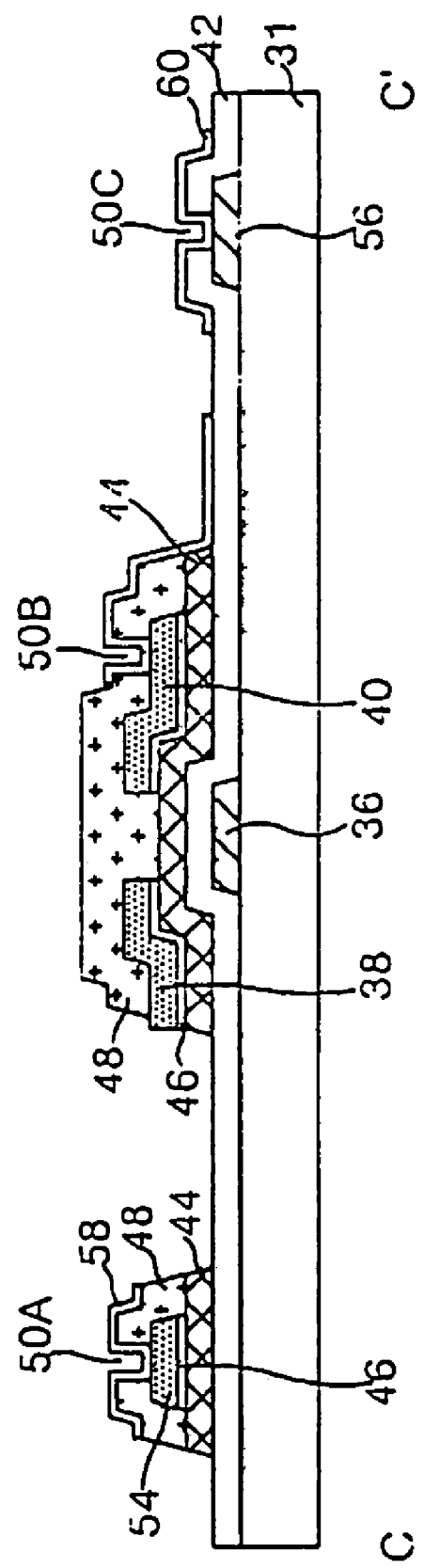
FIG. 9 is a section view of the thin film transistor of FIG. 8 taken along the C-C' line in FIG. 8

Referring now to FIG. 8 and FIG. 9, a TFT substrate 31 according to a second embodiment of the present invention includes the same configuration of elements as the TFT substrate 31 shown in FIGS. 4 and 5, except that an active layer 44 and a protective layer 48 of a semiconductor layer are formed during the same patterning. This enables TFT substrate fabrication using only four masks. The gate electrode 36 and the gate pad 56 are formed using a first mask. The ohmic contact layer 46, the data pad 54, and the source and the drain electrode 38 and 40 are formed using a second mask. The active layer 44, the data contact hole 50A, the drain contact hole 50B, the gate contact hole 50C, and the protective layer 48 are formed using a third mask. The pixel electrode 52, the data pad terminal electrode 58, and the gate pad terminal electrode 60 are formed using a fourth mask.

The fabricating method of such a TFT substrate will be described in conjunction with FIG. 10A to 11F.

Figure 10A:
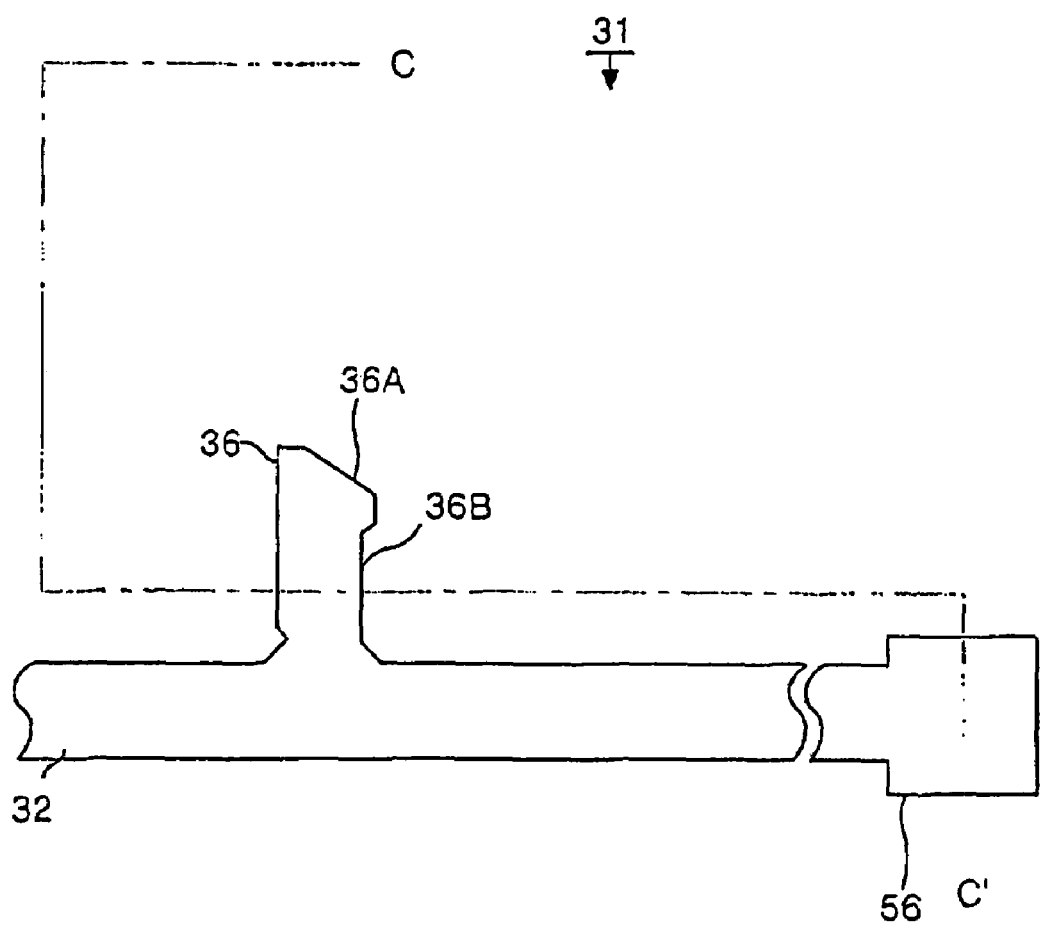
FIG. 10A to FIG. 10D are plan views representing step by step a method of fabricating the thin film transistor of FIG. 8.

Referring now to FIGS. 10A and 11A, the gate electrode 36 having an inclined head 36A and a concave neck 36B, and a gate pad 56 are provided on a substrate 31. The gate electrode 36 and gate pad 56 are formed by depositing aluminum (Al) or copper (Cu), such as by sputtering, and then by patterning the deposited metal using a first mask. The head 36A is beneficially formed consistent with the rubbing direction used to produce uniform alignment of the liquid crystal cell (reference the background section). The inclination angle of the head 36A is around 35° to 45° (for TN mode substrates), while the width of the concave neck 36B is smaller, by about 5 μm, than the maximum width of the gate electrode head 36A.

Figure 10B:
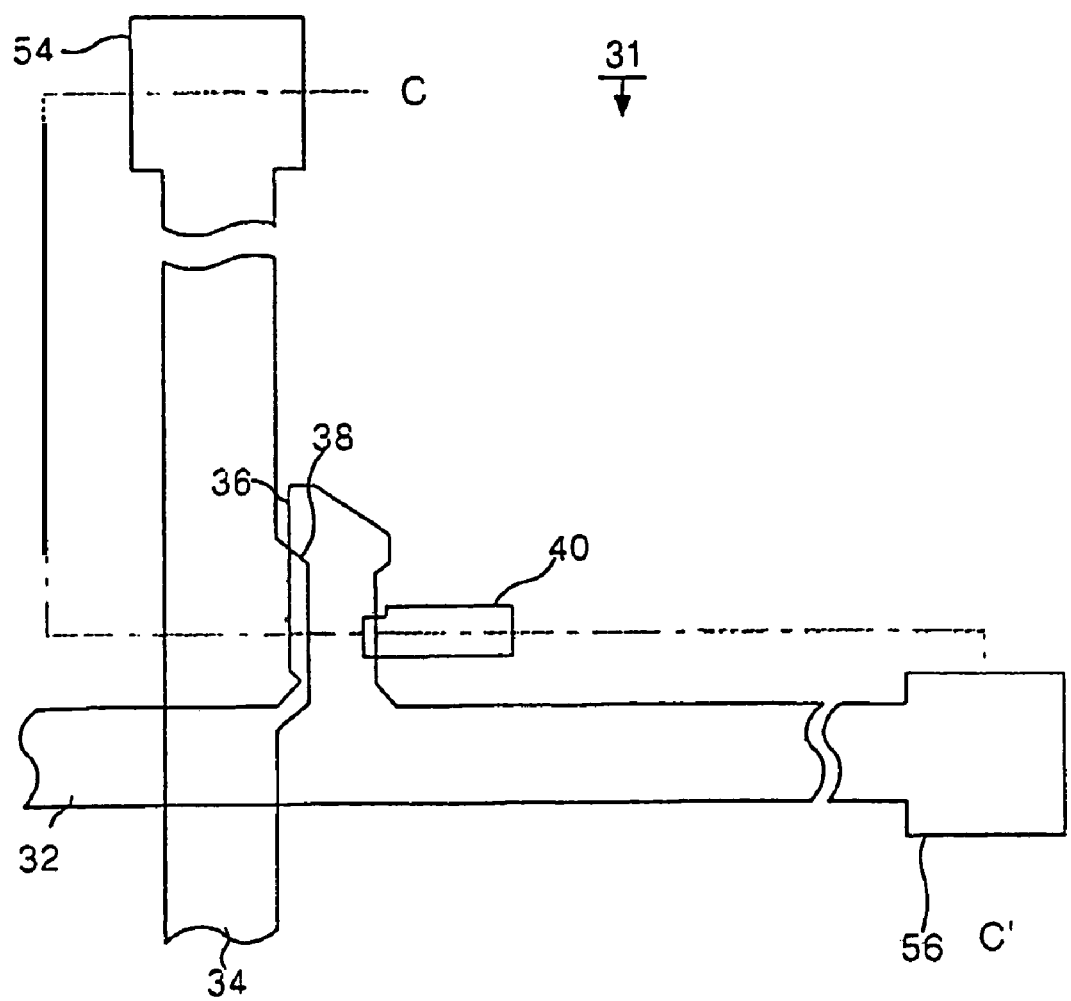

Referring now to FIG. 10B and FIG. 11B, a gate insulating film 42 and a first semiconductor layer 44A are formed over the substrate 31 (see below). Then, an ohmic contact layer 46, a data pad 54, and source and drain electrodes 38 and 40 are provided on a first semiconductor layer 44a. The ohmic contact layer 46, the data pad 54 and the source and drain electrodes 38 and 40 are formed by depositing a second semiconductor layer and a metal layer, and then patterning those layer using a second mask.

After the source and drain electrodes 38 and 40 are patterned, the ohmic contact layer 46, which is over the gate electrode 36, is patterned to expose the first semiconductor layer 44A. The first semiconductor layer 44A between the source and drain electrodes 38 and 40 acts as a channel.

The gate insulating film 42 is formed by depositing an insulating material such as silicon nitride SiNx or silicon oxide SiOx by plasma enhanced chemical vapor deposition PECVD. The first semiconductor layer 44A is formed from undoped noncrystalline silicon, while the ohmic contact layer 46 is formed from heavily doped non-crystalline silicon. Also, the data pad 54 and the source and drain electrodes 38 and 40 are formed from chrome Cr or molybdenum Mo.

Referring now to FIG. 11C, an insulating material 48A and a photoresist 70A are provided over the gate insulating film 42. A half-turn mask 72 (the third mask) having a transmission part 72b, a semi-transmission part 72c, and a shielding part 72a is positioned over the photoresist 70A. Ultraviolet light is selectively passed through the half-turn mask 72 to expose the photoresist 70A. The transmission part 72b is positioned at areas where the data contact hole, the drain contact hole, and the gate contact hole are to be formed. The shielding part 72a is positioned where the data pad and the source and drain electrodes are to be formed. The semi-transmission part 72c is positioned elsewhere.

Still referring to FIG. 11C, the insulating material 48 is made from an inorganic insulating material such as silicon nitride (SiNx) or silicon oxide (SiOx), an acrylic organic compound, or an organic insulating material having a small dielectric constant, such as Teflon, BCB (benzocyclobutene), Cytop or PFCB (perfluorocyclobutane).

Figure 11D:
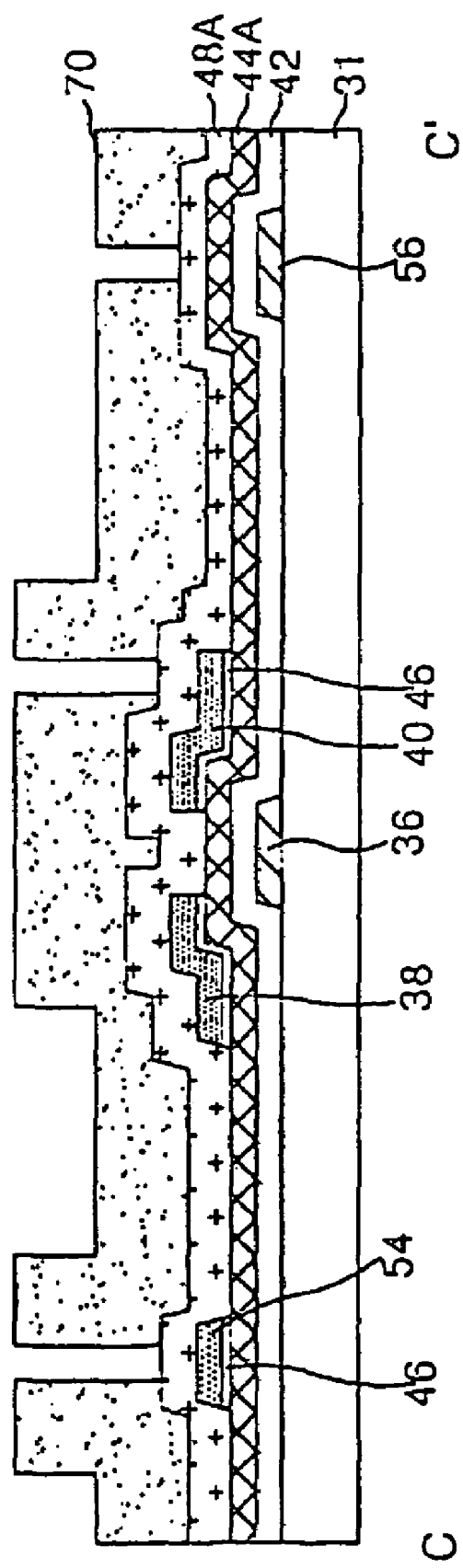

Referring now to FIG. 11D, a photoresist pattern 70 is formed after the photoresist 70A is developed using an alkali aqueous solution. The photoresist pattern 70 is thick where the data pad and the source and the drain electrodes are to be formed later. The photoresist pattern 70 is removed where the data contact hole, the gate contact hole and the drain contact hole are to be formed later. The photoresist pattern 70 sustains 10~50% of its initial thickness elsewhere.

Figure 10C:
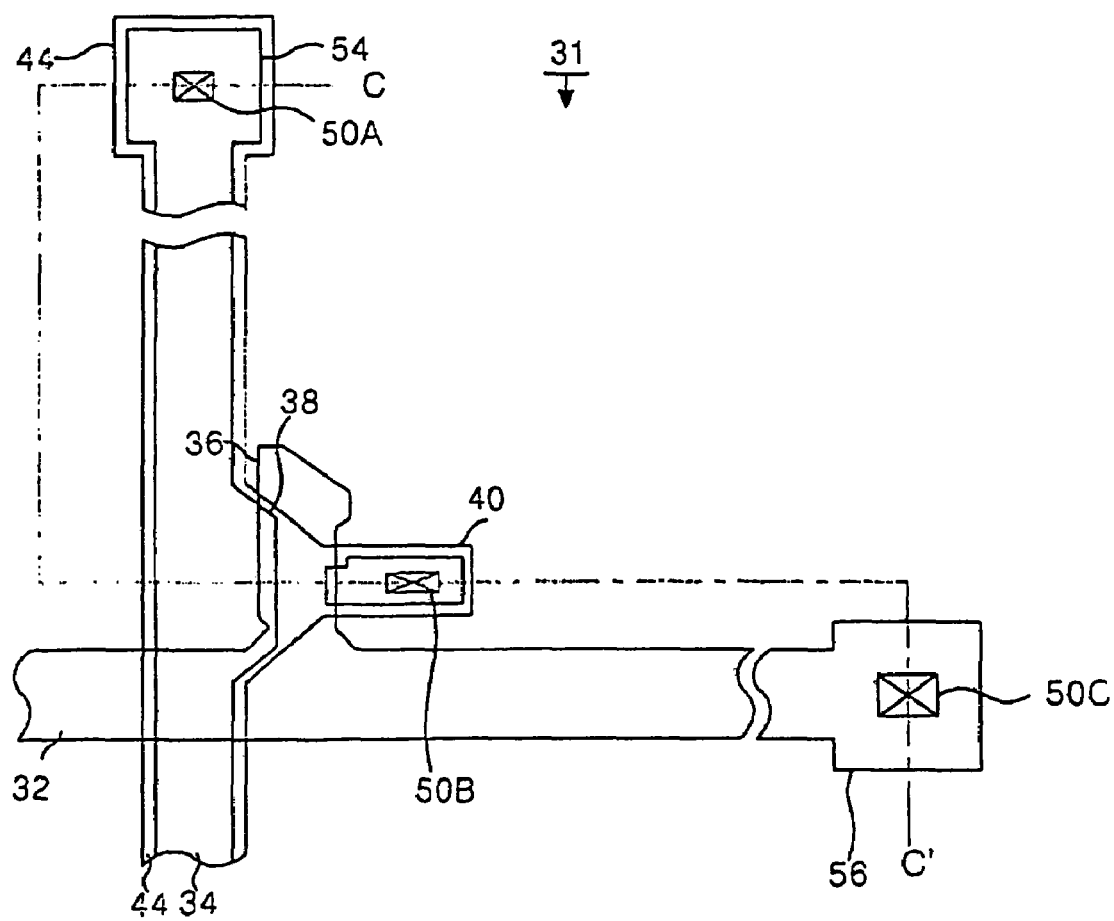

Referring now to FIG. 10C and to FIG. 11E, the active layer 44, the protective layer 48, the data contact hole 50A, the drain contact hole 50B and the gate contact hole 50C are provided over the gate insulating layer 42. The active layer 44, the protective layer 48, the data contact hole 50A, the drain contact hole 50B, and the gate contact hole 50C are formed by simultaneously patterning the insulating material 48a and the first semiconductor layer 44A using the photoresist pattern 70 as a mask.

Figure 10D:
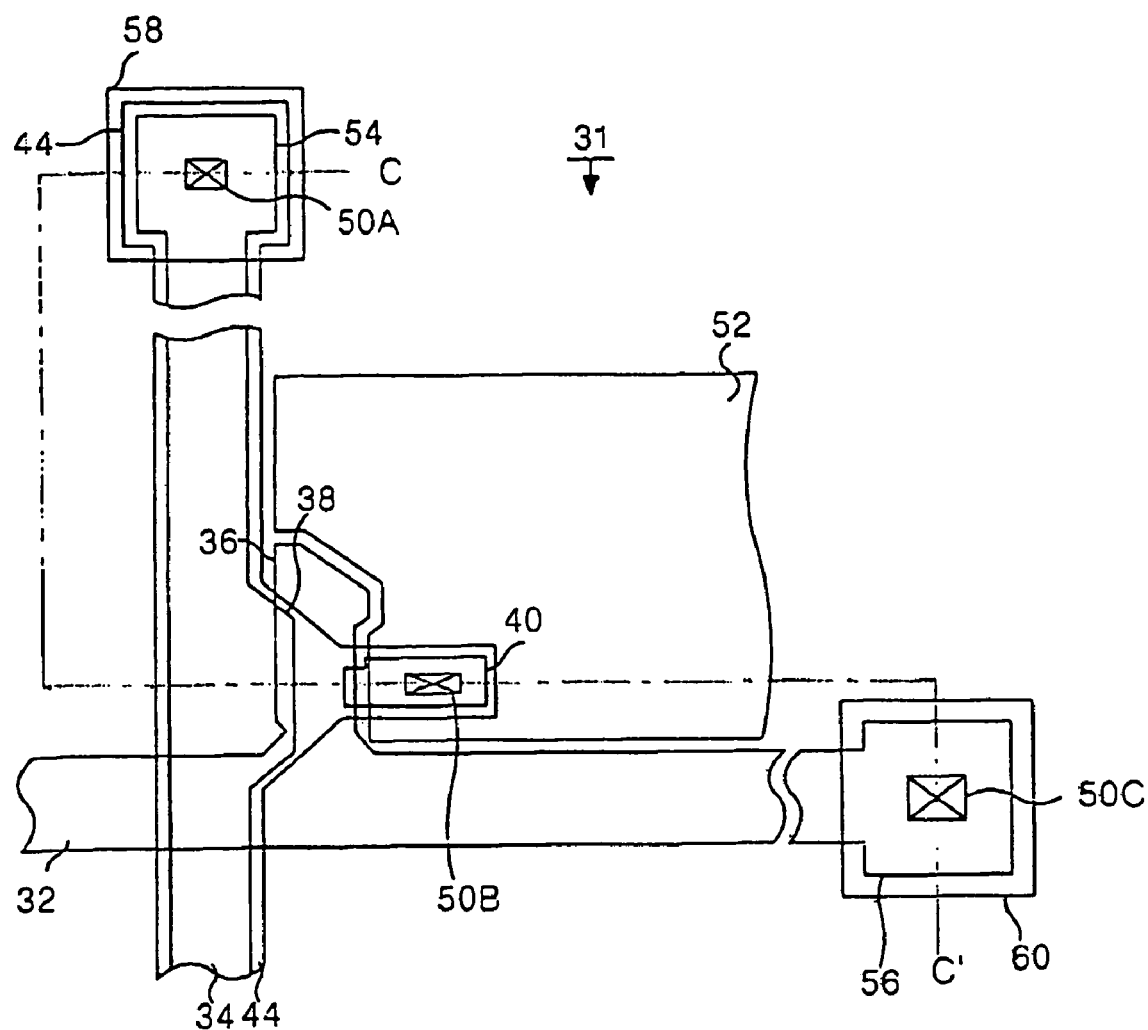

Referring now to FIG. 10D and to FIG. 11F, the pixel electrode 52, the gate pad terminal electrode 60, and the data pad terminal electrode 58 are provided on the protective layer 48. The pixel electrode 52, the gate pad terminal electrode 60 and the data pad terminal electrode 58 are formed by depositing a transparent conductive material such as indium-tin-oxide (ITO), indium-zinc-oxide (IZO) or indium-tin-zinc-oxide (ITZO) on the protective layer 48, and then patterning that conductive layer using the fourth mask. As shown, the pixel electrode 52 is electrically connected via the drain contact hole 50B to the drain electrode 40, the gate pad terminal electrode 60 is electrically connected via the gate contact bole 50C to the gate pad 56, and the data pad terminal electrode is electrically connected via the data contact hole 50A to the data pad 54.

Figure 12:
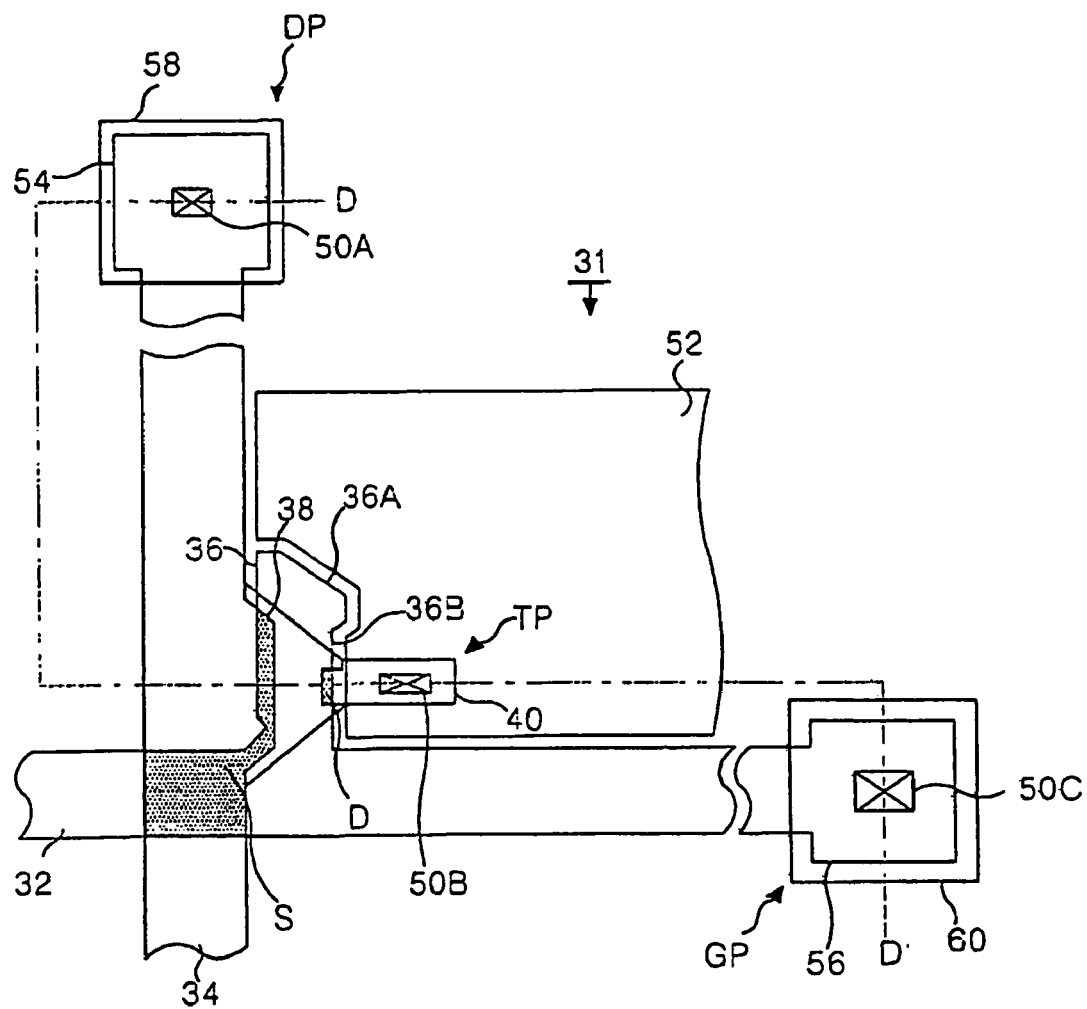
FIG. 12 is a plan view showing a structure of a thin film transistor according to a third embodiment of the present invention.

Referring now to FIG. 12 and FIG. 13, a TFT substrate 31 according to a third embodiment of the present invention includes the same configuration elements as the TFT substrate 31 shown in FIGS. 4 and 5, except that semiconductor layers 44 and 46, a data pad 54, and a source and a drain electrodes 38 and 40 are formed using the same mask pattern.

The TFT substrate 31 shown in FIG. 12 and FIG. 13 requires four masks. The gate electrode 36 and the gate pad 56 are formed using a first mask. The semiconductor layers 44 and 46, the data pad 54, and the source and drain electrodes 38 and 40 are formed using a second mask. The data contact hole 50A the drain contact hole 50B, the gate contact hole 50C, and the protective layer 48 are formed using a third mask. The pixel electrode 52, the data pad terminal electrode 58 and the gate pad terminal electrode 60 are formed using a fourth mask.

The gate electrode 36 formed on the TFT substrate 31 includes an inclined head 36A and a concave neck 36B. The inclination angle of the head 36A is around 35° to 45°, while the width of the neck 36B is smaller, by about 5 μm, than the maximum width of the gate electrode head 36A. The head 36A is beneficially coincident with a rubbing direction of the liquid crystal.

Figure 14A:
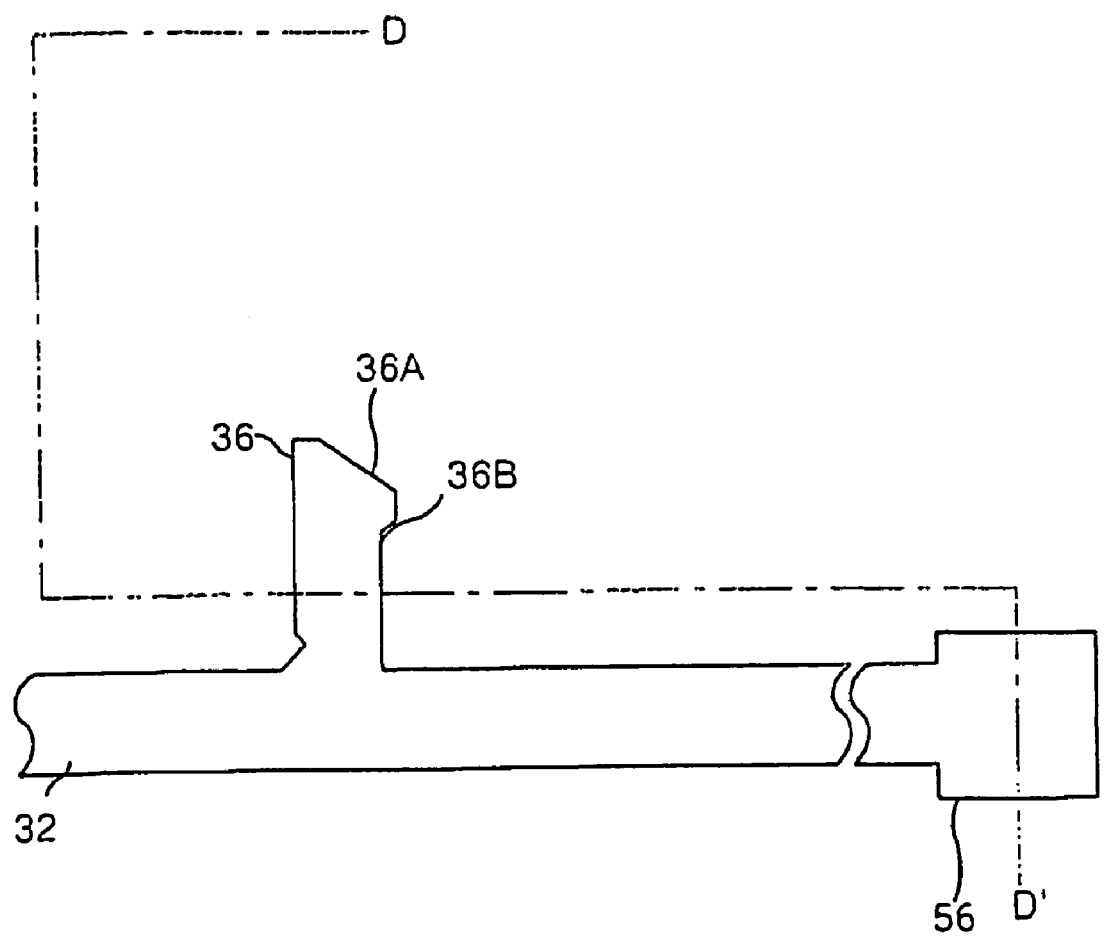
FIG. 14A to FIG. 14D are plan views representing step by step a method of fabricating the thin film transistor of FIG. 12.

The fabricating method of such a TFT substrate will be described in conjunction with FIG. 14A to 15F. Referring first to FIG. 14A and to FIG. 15A, a gate pad 56 and a gate electrode 36 having an inclined head 36A and a concave neck 36B are provided on a substrate 31. The gate electrode 36 and the gate pad 56 are formed by depositing aluminum (Al) or copper (Cu) and then patterning that deposited metal using a first mask.

Referring now to FIG. 15B, a gate insulating film 42, a first semiconductor layer 44A, a second semiconductor layer 46A, and a metal layer 39 are then provided over the substrate 31. Then, a photoresist layer 74A is provided over the metal layer 39. A diffractive exposure mask 76 (a second mask) having a transmission part 76C, a diffraction part 76A and a shielding part 76B, is then located over the photoresist 74A. The diffractive exposure mask 76 is used to selectively irradiate ultraviolet light onto the photoresist 74A so as to expose it. The diffraction part 76A is positioned where a channel is to be formed. The shielding pat 76B is positioned where the data pad, the source electrode, and the drain electrode are to be formed. The transmission part 76C is positioned elsewhere.

Still referring to FIG. 15B, the gate insulating film 42 is formed by depositing an insulating material such as silicon nitride (SiNx) or silicon oxide (SiOx) by plasma enhanced chemical vapor deposition (PECVD). The first semiconductor layer 44A is formed from undoped non-crystalline silicon, while the second semiconductor layer 46A is formed from heavily doped non-crystalline silicon. The metal layer 39 is beneficially formed from chrome (Cr) or molybdenum (Mo).

Referring now to FIG. 15C, a photoresist pattern 74 is formed on the metal layer 39 by developing the photoresist layer 74A with a developer, such as an alkali aqueous solution. The photoresist pattern 74 has the same thickness as its initial-spread thickness where the data pad and the source and drain electrodes are to be formed. The photoresist pattern 74 is formed to sustain 10~50% of its initial-spread thickness where a channel is to be formed. Other areas of the photoresist layer 74A are removed.

Figure 14B:
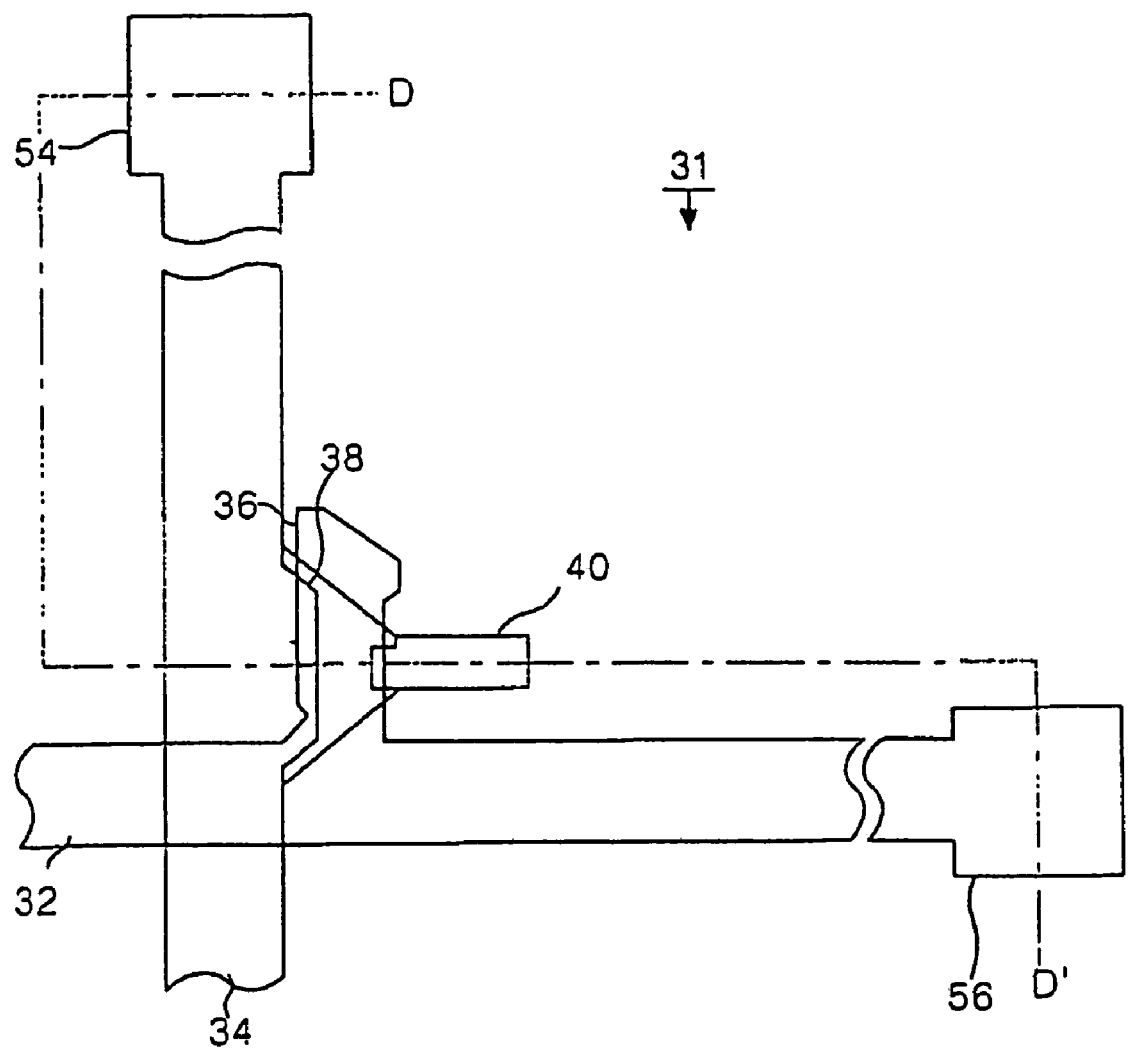

Referring now to FIG. 14B and to FIG. 15D, the active layer 44, the ohmic contact layer 46, and the source and drain electrodes 38 and 40 are provided over the gate insulating film 42. The active layer 44, the ohmic contact layer 46, and the source and drain electrodes 38 and 40 are formed by simultaneously patterning the metal layer 39 and the first and second semiconductor layers 44A and 46A using the photoresist pattern 74 as a mask.

Figure 14C:
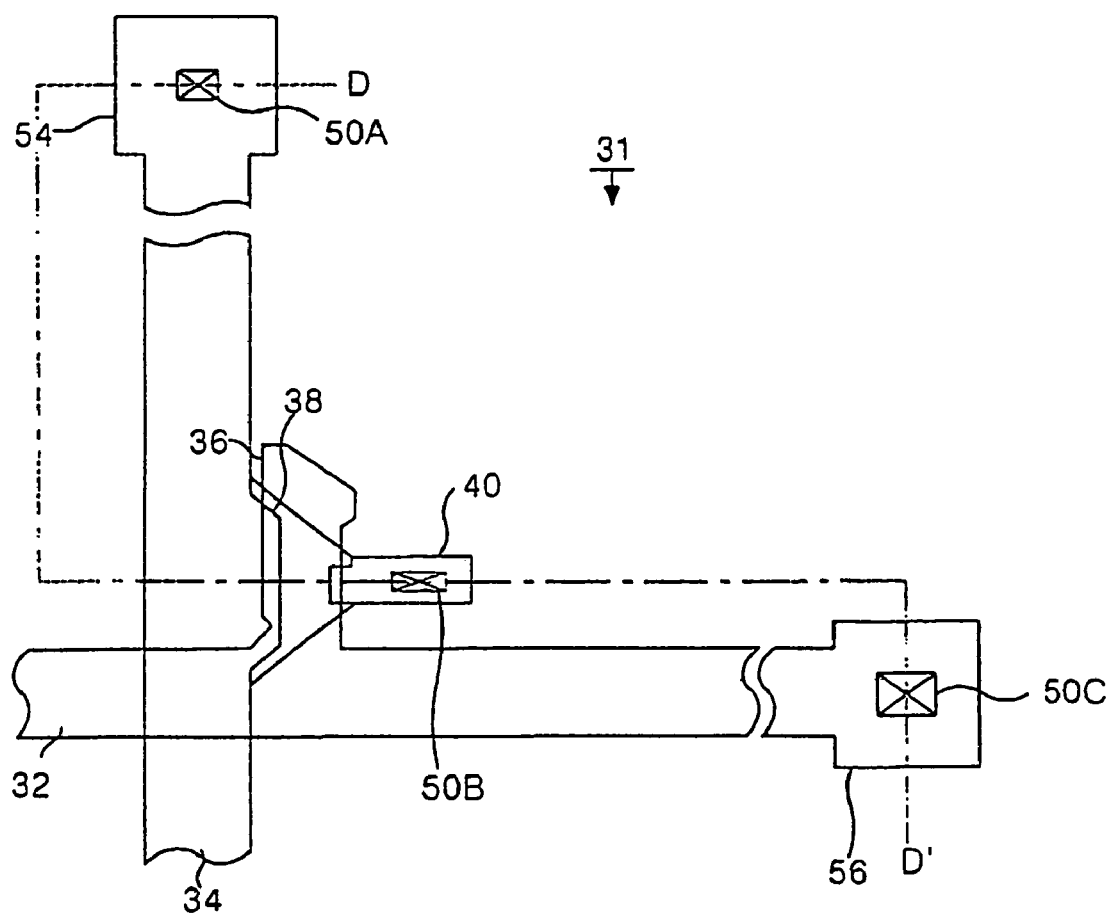

Referring now to FIG. 14C and FIG. 15E, the protective layer 48, the data contact hole 50A, the drain contact hole 50B, and the gate contact hole 50C are then provided. The protective layer 48 is made from an inorganic insulating material such as silicon nitride (SiNx) or silicon oxide (SiOx), from an acrylic organic compound, or from an organic insulating material having a small dielectric constant, such as Teflon, BCB (benzocyclobutene), Cytop or PFCB (perfluorocyclobutane). The protective layer 48, the data contact hole 50A, the drain contact hole 50B, and the gate contact hole 50C are formed by depositing an insulating material on the gate insulating layer 42 and then patterning that insulting material using the third mask.

Figure 14D:
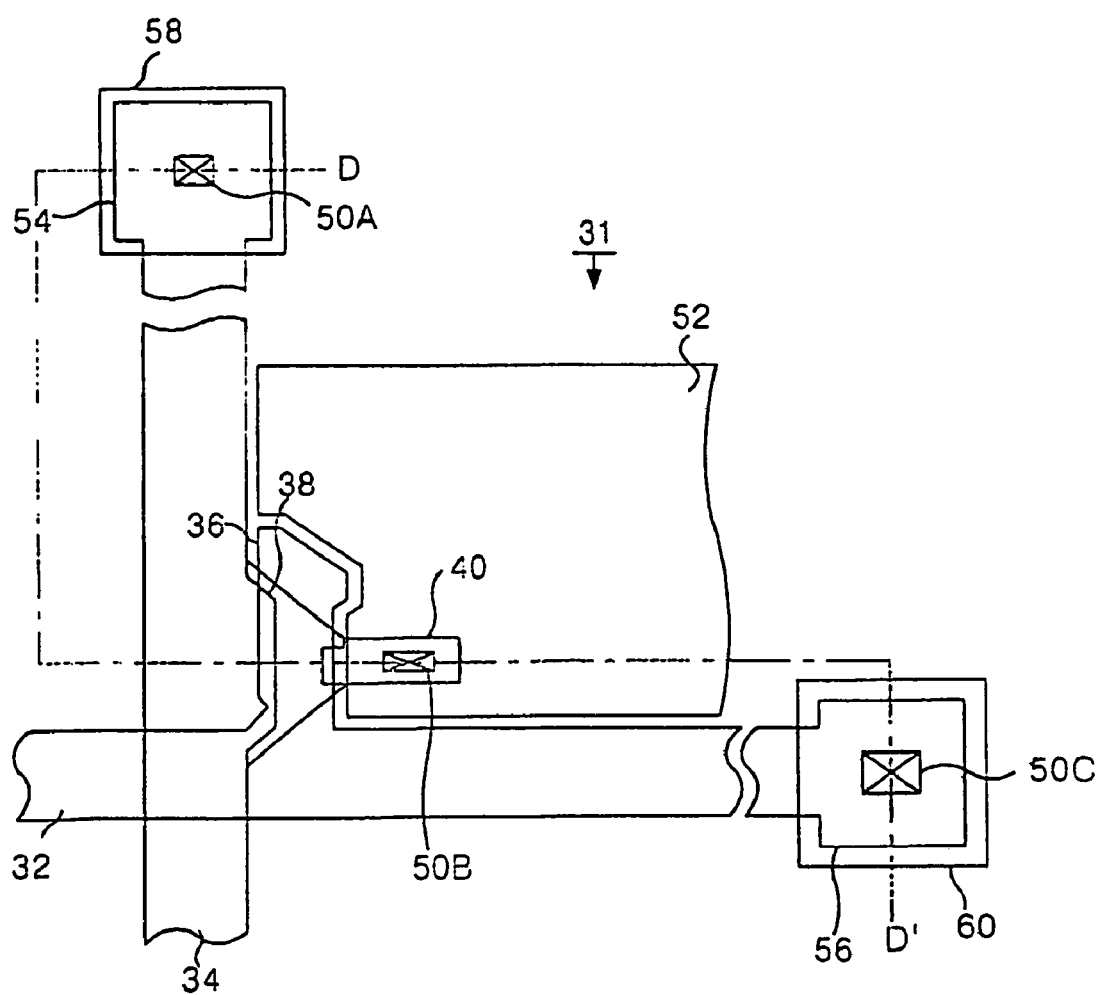

Referring now to FIGS. 14D and 15F, the pixel electrode 52, the gate pad terminal electrode 60, and the data pad terminal electrode 58 are then provided on the protective layer 48. The pixel electrode 52, the gate pad terminal electrode 60, and the data pad terminal electrode 58 are formed by depositing a transparent conductive material such as indium-tin-oxide (ITO), indium-zinc-oxide (IZO) or indium-tin-zinc-oxide (ITZO) on the protective layer 48 and then patterning that transparent conductive material using the fourth mask.

The pixel electrode 52 is electrically connected via the drain contact hole 50B to the drain electrode 40. The gate pad terminal electrode 60 is electrically connected via the gate contact hole 50C to the gate pad 56. The data pad terminal electrode is electrically connected via the data contact hole 50A to the data pad 54.

As described above, according to the principles of the present invention, the head of the gate electrode follows the rubbing direction of the liquid crystal, thereby defining the upper portion of the gate electrode with an inclination. The head of the gate electrode improves an aperture ratio.

In addition, the middle portion of the gate electrode has a width smaller than the upper portion. This reduces overlapping areas (D and S in the figures) of the gate electrode, the source electrode and the drain electrode, which reduces parasitic capacitances Cgs and Cgd. Accordingly, image flicker and residual images are reduces, which improves display quality.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A method of fabricating a thin film transistor substrate, comprising:
   forming a gate metal layer on a substrate; and
   patterning the gate metal layer to form a gate line and a gate electrode extending from the gate line and having a head portion inclined at an angle greater than zero degrees with respect to the gate line and substantially parallel with a rubbing direction of the substrate.

2. The method as claimed in claim 1, further comprising the steps of:
   forming a gate insulating film on the substrate and over the gate electrode;
   forming a semiconductor layer on the gate insulating film;
   forming source and drain electrodes on the semiconductor layer so as to define a channel;
   forming a protective layer on the gate insulating film and over the source and drain electrodes; and
   forming a pixel electrode on the protective layer.

3. The method as claimed in claim 1, further comprising the steps of:
   forming a gate insulating film on the substrate in such a manner as to cover the gate electrode;
   depositing first and second semiconductor layers and a metal layer on the gate insulating film;
   patterning the metal layer and the second semiconductor layer to form source and drain electrodes;
   providing a protective material layer on the first semiconductor layer in such a manner as to cover the source and drain electrodes, patterning the first semiconductor layer and the protective layer material to form a protective layer and a semiconductor pattern; and forming a pixel electrode on the protective layer.

4. The method as claimed in claim 1, further comprising the steps of:

forming a gate insulating film and a semiconductor material on the substrate in such as a manner to cover the gate electrode;

forming source and drain electrodes on the semiconductor material;

depositing a protective layer material on the gate insulating film in such a manner as to cover the source and drain electrodes, simultaneously patterning the semiconductor material and the protective layer material to form a semiconductor pattern and a protective layer; and forming a pixel electrode on the protective layer.

5. The method as claimed in claim 1, further comprising the steps of forming a gate electrode having a neck portion that is narrower than a maximum width of the head portion by less than about 5 μm.

6. The method as claimed in claim 5, further comprising the steps of:

forming a gate insulating film over the gate electrode;

forming a semiconductor layer on the gate insulating film; and forming source and drain electrodes on the semiconductor layer so as to define a channel.

7. The method as claimed in claim 6, further comprising the steps of providing a protective material layer on the semiconductor layer.

8. The method as claimed in claim 7, further comprising the steps of forming a pixel electrode on the protective layer.

* * * * *